(12) United States Patent
Lee

(10) Patent No.: US 11,258,442 B2
(45) Date of Patent: Feb. 22, 2022

(54) SEMICONDUCTOR APPARATUS

(71) Applicant: SK hynix Inc., Icheon-si (KR)

(72) Inventor: Seung Ho Lee, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/138,634

(22) Filed: Dec. 30, 2020

(65) Prior Publication Data

US 2021/0143813 A1 May 13, 2021

Related U.S. Application Data

(63) Continuation of application No. 16/827,854, filed on Mar. 23, 2020, now Pat. No. 10,892,750, which is a continuation-in-part of application No. 16/656,217, filed on Oct. 17, 2019, now Pat. No. 10,848,154, which is a continuation-in-part of application No.
(Continued)

(30) Foreign Application Priority Data

May 31, 2018 (KR) .......................... 10-2018-0063012
Dec. 17, 2018 (KR) .......................... 10-2018-0162871

(51) Int. Cl.
*H03K 3/02* (2006.01)
*H03L 7/00* (2006.01)
*H03K 3/3565* (2006.01)
*H03K 5/24* (2006.01)
*H03K 19/20* (2006.01)
*H03K 17/22* (2006.01)
*G01R 19/165* (2006.01)
*H03K 5/00* (2006.01)

(52) U.S. Cl.
CPC ...... *H03K 17/223* (2013.01); *G01R 19/16595* (2013.01); *H03K 3/3565* (2013.01); *H03K 5/2472* (2013.01); *H03K 2005/00013* (2013.01)

(58) Field of Classification Search
None
See application file for complete search history.

(56) References Cited

U.S. PATENT DOCUMENTS 5,852,540 A 12/1998 Haider
6,204,701 B1 3/2001 Tsay et al.
(Continued)

FOREIGN PATENT DOCUMENTS

KR 1020080038954 A 5/2008

OTHER PUBLICATIONS

Chen, S. et al., An Output Buffer for 3.3-V Applications in a 0.13-1-μm 1/2.5-V CMOS Process, Jan. 2007, pp. 14-18, vol. 54, No. 1, IEEE.
(Continued)

*Primary Examiner* — Kenneth B Wells
(74) *Attorney, Agent, or Firm* — William Park & Associates Ltd.

(57) ABSTRACT

A semiconductor apparatus includes a control circuit and a level shifter. The control circuit is configured to output a power control signal for activating a data input/output circuit operated by a first voltage when the first voltage is higher than a first set voltage and a second voltage is higher a second set voltage. The level shifter configured to receive the power control signal and lower operating voltages of devices including a plurality of transistors with a thin gate insulating layer based on the power control signal.

29 Claims, 15 Drawing Sheets

Related U.S. Application Data

16/227,975, filed on Dec. 20, 2018, now Pat. No. 10,763,835.

(56) References Cited

U.S. PATENT DOCUMENTS

| | | | |
|---|---|---|---|
| 6,342,803 | B1 | 1/2002 | McManus |
| 6,693,469 | B2 | 2/2004 | Prodanov |
| 7,161,396 | B1 | 1/2007 | Zhou et al. |
| 7,504,862 | B2 | 3/2009 | Sandre et al. |
| 7,719,806 | B1 | 5/2010 | Boyd et al. |
| 8,212,590 | B2 | 7/2012 | Wang et al. |
| 8,610,488 | B2 | 12/2013 | Yu et al. |
| 8,803,580 | B2 | 8/2014 | Shi et al. |
| 8,817,434 | B2 | 8/2014 | Wang et al. |
| 8,994,412 | B2 | 3/2015 | Kim |
| 9,419,615 | B2 | 8/2016 | Hsu et al. |
| 10,088,882 | B2 | 10/2018 | Aoki |
| 10,193,545 | B1 | 1/2019 | Pankratz et al. |
| 10,382,040 | B2 | 8/2019 | Kwon et al. |
| 10,892,750 | B2 * | 1/2021 | Lee .............. H03K 17/223 |
| 2006/0226873 | A1 | 10/2006 | Sandre et al. |
| 2006/0255852 | A1 | 11/2006 | O'Donnell et al. |
| 2008/0054982 | A1 | 3/2008 | Rhee |
| 2010/0141324 | A1 | 6/2010 | Wang et al. |
| 2010/0176848 | A1 | 7/2010 | Du et al. |
| 2010/0271118 | A1 | 10/2010 | Bhattacharya et al. |
| 2012/0049939 | A1 | 3/2012 | Maede |
| 2016/0372918 | A1 | 12/2016 | Chen et al. |
| 2018/0342280 | A1 | 11/2018 | Lee |
| 2019/0158085 | A1 | 5/2019 | Rizvi et al. |

OTHER PUBLICATIONS

Guo, H. et al., A Novel Mixed-Voltage I/O Buffer With Low-Voltage Thin-Oxide CMOS Transistors, 2014, IEEE.

Ismail, Y. et al., A Compact Stacked-Device Output Driver in Low-Voltage CMOS Technology, 2014, pp. 1624-1627, IEEE.

Karthik Rajagopal et al., "An Enhanced Topology for Reliability of a High Performance 3.3V I/O Buffer in a Single-well Bulk CMOS 1.8v-oxide Low voltage Process", 10th Int'l Symposium on Quality Electronic Design, 2009, pp. 103-106, IEEE, Bagmane Tech Park Bangalore, Karnataka—560093 India.

Karthik Rajagopal et al., "Dynamically Biased Low Power High Performance 3.3V Output Buffer in a Single Well Bulk CMOS 1.8V Oxide 45nm Process", 13th Int'l Symposium on Quality Electronic Design, 2012, pp. 159-164, IEEE, Bagmane Tech Park Bangalore, Karnataka—560993 India.

Liu, G. et al., A New Design of Mixed-Voltage I/O Buffers with Low-Voltage-Thin-Oxide CMOS Process, 2007, pp. 201-204, IEEE.

Marcs NG, "3.3V Transmitter Using 1.8V Transistors in a Cascode Configuration", Jan. 1, 2013, pp. 1-41, Paper 2056, Ryerson University.

Vinod Kumar, et al., "Power Sequence free 400Mbps 90μW 6000μm2 1.8V-3.3V Stress Tolerant I/O Buffer in 28nm CMOS", 2013, pp. 37-40, IEEE, Greater Noida, Uttar Pradesh, India.

* cited by examiner

SEMICONDUCTOR APPARATUS

CROSS-REFERENCES TO RELATED APPLICATION

The present application is a continuation application of U.S. patent application Ser. No. 16/827,584 filed on Mar. 23, 2020 (now issued as U.S. Pat. No. 10,892,750 on Jan. 12, 2021), which is a continuation-in-part application of U.S. application Ser. No. 16/227,975, filed on Dec. 20, 2018, (now issued as U.S. Pat. No. 10,763,835 on Sep. 1, 2020) and U.S. application Ser. No. 16/656,217, filed on Oct. 17, 2019 (now issued as U.S. Pat. No. 10,848,154 on Nov. 24, 2020) and claims priority under 35 U.S.C 119(a) to Korean Application No. 10-2018-0063012 and 10-2018-0162871, filed on May 31, 2018 and Dec. 17, 2018 respectively, which is incorporated herein by reference in its entirety.

BACKGROUND

1. Technical Field

Various embodiments generally relate to a semiconductor integrated circuit, and more particularly, to a semiconductor apparatus.

2. Related Art

A semiconductor apparatus is developed to transmit/receive a larger amount of data at high speed.

In order to normally transmit/receive a larger amount of data at high speed, the semiconductor apparatus is designed in such a manner that a voltage used therein is divided into a voltage used by circuits that transmit/receive data and a voltage used by circuits that do not transmit/receive data.

The semiconductor apparatus is designed to operate based on voltages received from a plurality of voltage sources, and developed to reduce power consumption used therein.

SUMMARY

In an embodiment, a semiconductor apparatus comprises a control circuit configured to output a power control signal for activating a data input/output circuit operated by a first voltage when the first voltage is higher than a first set voltage and a second voltage is higher a second set voltage; and a level shifter configured to receive the power control signal and lower operating voltages of devices including a plurality of transistors with a thin gate insulating layer based on the power control signal.

DETAILED DESCRIPTION

Hereinafter, a semiconductor apparatus according to the present disclosure will be described below with reference to the accompanying drawings through exemplary embodiments.

Various embodiments are directed to a semiconductor apparatus capable of reducing power consumption.

Figure 1:
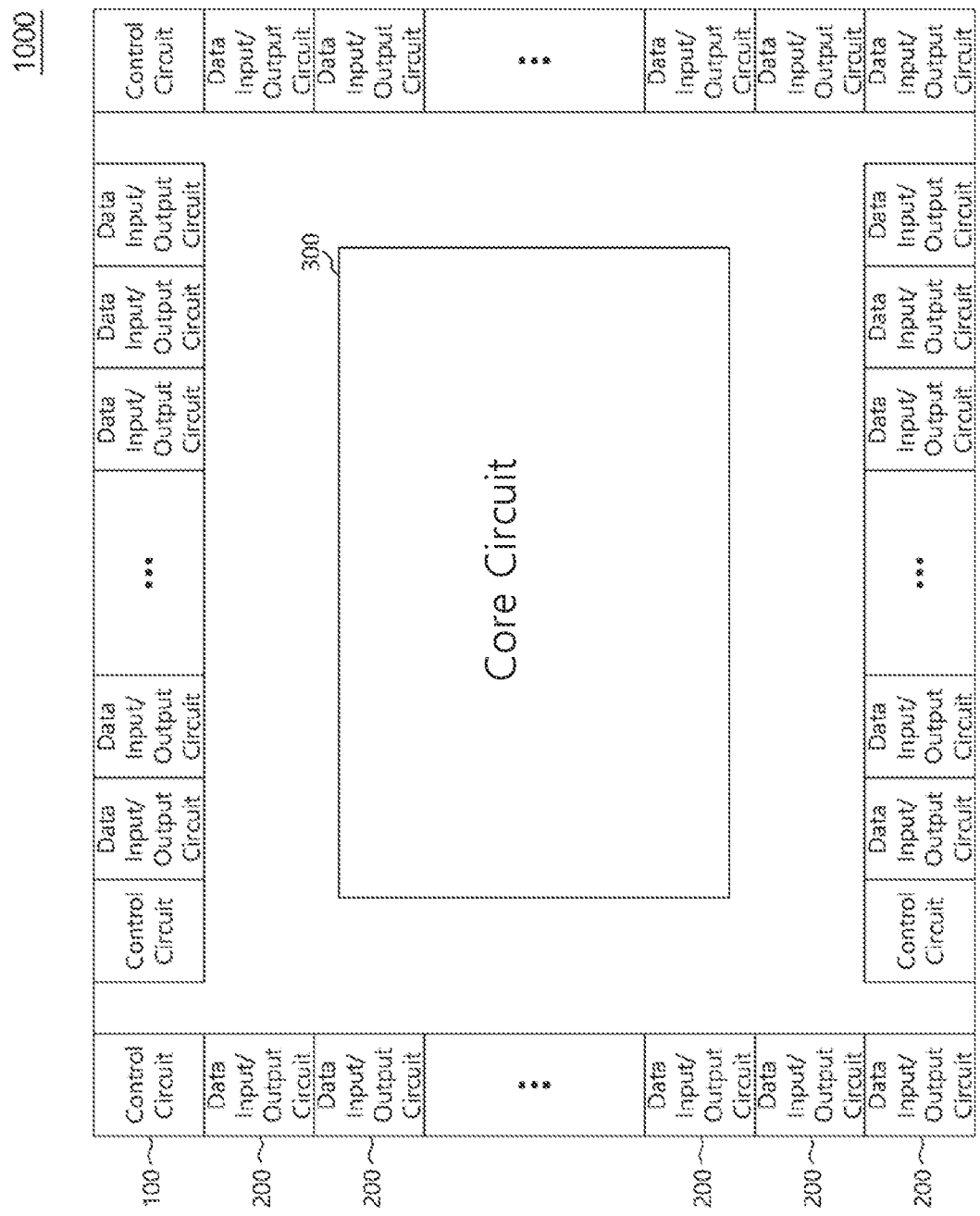
FIG. 1 is a configuration diagram illustrating a semiconductor apparatus in accordance with an embodiment.

As illustrated in FIG. 1, a semiconductor apparatus 1000 in accordance with an embodiment may include a plurality of control circuits 100, a plurality of data input/output circuits 200 and a core circuit 300.

Each of the control circuits 100 may detect a first voltage used in the core circuit 300 and a second voltage used in the data input/output circuits 200. Each of the control circuits 100 may activate or deactivate the data input/output circuits 200. For example, when both of the first and second voltages become equal to or higher than a set voltage level, each of the control circuits 100 may activate the plurality of data input/output circuits 200. On the other hand, when any one of the first and second voltages becomes lower than the set voltage level, each of the control circuits 100 may deactivate the plurality of data input/output circuits 200.

The plurality of data input/output circuits 200 may be activated to transmit data outputted from the core circuit 300 or receive data to be inputted to the core circuit 300. On the other hand, the plurality of data input/output circuits 200 may be deactivated to convert the state of an output node into a high impedance state.

The core circuit 300 may be configured to store data transferred from the plurality of data input/output circuits 200 or transfer data stored therein to the plurality of data input/output circuits 200.

Figure 2:
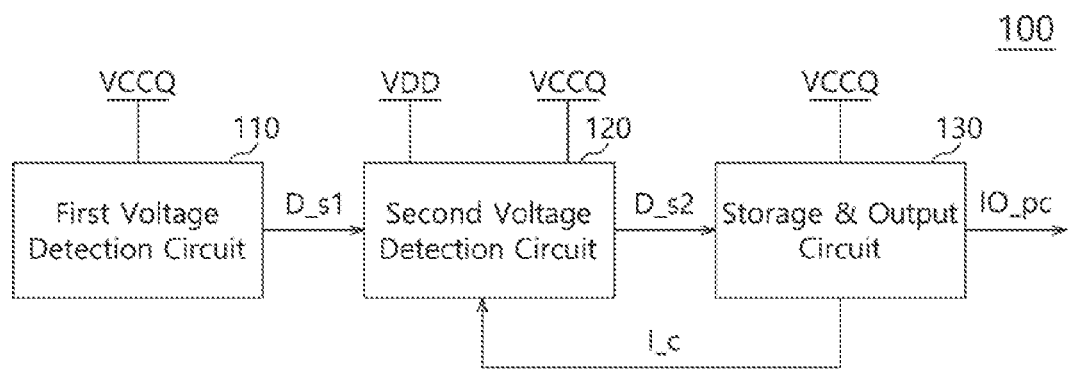
FIG. 2 is a configuration diagram illustrating a control circuit of FIG. 1.

FIG. 2 is a configuration diagram illustrating one control circuit 100 among the plurality of control circuits 100 illustrated in FIG. 1.

As illustrated in FIG. 2, the control circuit 100 may include a first voltage detection circuit 110, a second voltage detection circuit 120 and a storage and output circuit 130.

The first voltage detection circuit 110 may generate a first voltage detection signal D_s1 in response to the voltage level of a first voltage VCCQ. For example, when the voltage level of the first voltage VCCQ becomes equal to or higher than a first set voltage level, the first voltage detection circuit 110 may enable the first voltage detection signal D_s1 at a high level. On the other hand, when the voltage level of the first voltage VCCQ is lower than the first set voltage level, the first voltage detection circuit 110 may disable the first voltage detection signal D_s1 at a low level.

The second voltage detection circuit 120 may generate a second voltage detection signal D_s2 in response to the first voltage detection signal D_s1, a current control signal I_c and a second voltage VDD. For example, when the first voltage detection signal D_s1 is enabled and the voltage level of the second voltage VDD becomes equal to or higher than a second set voltage level, the second voltage detection circuit 120 may enable the second voltage detection signal D_s2 at a high level. On the other hand, when the first voltage detection signal D_s1 is disabled, the second voltage detection circuit 120 may disable the second voltage detection signal D_s2 at a low level. When the current control signal I_c is enabled at a high level, the second voltage detection circuit 120 may disable the second voltage detection signal D_s2 at a low level. Furthermore, when the current control signal I_c is enabled at a high level, the second voltage detection circuit 120 can reduce power or current consumption thereof.

The storage and output circuit 130 may generate a power control signal IO_pc in response to the second voltage detection signal D_s2. For example, when the second voltage detection signal D_s2 is enabled, the storage and output circuit 130 may enable the current control signal I_c, latch the enabled second voltage detection signal D_s2, and output the latched signal as the power control signal IO_pc. On the other hand, when the second voltage detection signal D_s2 is disabled, the storage and output circuit 130 may disable the current control signal I_c and disable the power control signal IO_pc at a low level.

At this time, the first voltage VCCQ may be supplied to the plurality of data input/output circuits 200 of FIG. 1, and the second voltage VDD may be supplied to the core circuit 300 of FIG. 1. The power control signal IO_pc may be inputted to the plurality of data input/output circuits 200. The plurality of data input/output circuits 200 may be activated when the power control signal IO_pc is enabled, and deactivated when the power control signal IO_pc is disabled.

Figure 3:
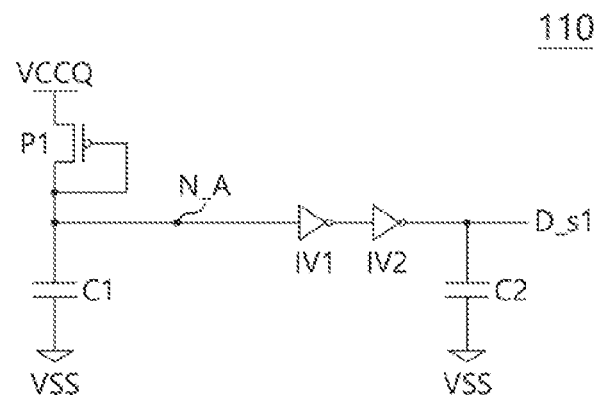
FIG. 3 is a configuration diagram illustrating a first voltage detection circuit of FIG. 2.

FIG. 3 is a configuration diagram illustrating the first voltage detection circuit 110 of FIG. 2.

As illustrated in FIG. 3, the first voltage detection circuit 110 may include a first transistor P1, a first capacitor C1, and a second capacitor C2. The first voltage detection circuit 110 may also be configured to perform a first inversion operation and a second inversion operation. For example, the first voltage detection circuit 110 may include a first inverter IV1, a second inverter IV2.

The first transistor P1 may have a source configured to receive the first voltage VCCQ and a drain and gate coupled to a first node N_A in common.

The first capacitor C1 may have one terminal coupled to the first node N_A and the other terminal coupled to a ground terminal VSS.

The first inverter IV1 may have an input terminal coupled to the first node N_A.

The second inverter IV2 may have an input terminal coupled to an output terminal of the first inverter IV1 and an output terminal configured to output the first voltage detection signal D_s1.

The second capacitor C2 may have one terminal coupled to the output terminal of the second inverter IV2 and the other terminal coupled to the ground terminal VSS.

Figure 4:
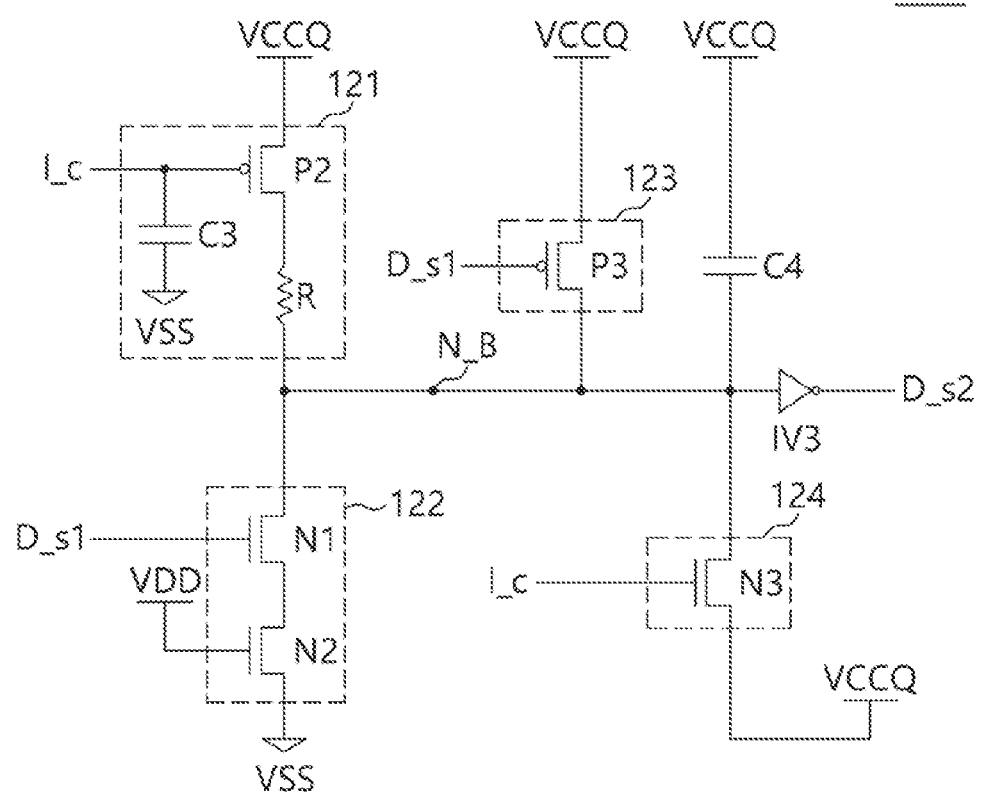
FIG. 4 is a configuration diagram illustrating a second voltage detection circuit of FIG. 2.

FIG. 4 is a configuration diagram illustrating the second voltage detection circuit 120 of FIG. 2.

As illustrated in FIG. 4, the second voltage detection circuit 120 may include a first current source circuit 121, a first current sink circuit 122, a second current source circuit 123, a third current source circuit 124, and a third capacitor C3. The second voltage detection circuit 120 may also be configured to perform a third inversion operation. For example, second voltage detection circuit 120 may include a third inverter IV3.

The first current source circuit 121 may supply a current to the second node N_B in response to the current control signal I_c. For example, when the current control signal I_c is disabled at a low level, the first current source circuit 121 may raise the voltage level of the second node N_B by supplying a current to the second node N_B. On the other hand, when the current control signal I_c is enabled at a high level, the first current source circuit 121 may stop supplying the current to the second node N_B.

The first current source circuit 121 may include a third capacitor C3, a second transistor P2 and a resistor R.

The third capacitor C3 may have one terminal coupled to a gate of the second transistor P2 and the other terminal coupled to the ground terminal VSS.

The second transistor P2 may have the gate configured to receive the current control signal I_c, a source configured to receive the first voltage VCCQ, and a drain coupled to one terminal of the resistor R.

The resistor R may have the one terminal coupled to the drain of the second transistor P2 and the other terminal coupled to the second node N_B.

When the first voltage detection signal D_s1 is enabled and the voltage level of the second voltage VDD becomes equal to or higher than the second set voltage level, the first current sink circuit 122 may lower the voltage level of the second node N_B by passing the current of the second node N_B to the ground terminal VSS.

The first current sink circuit 122 may include third and fourth transistors N1 and N2.

The third transistor N1 may have a gate configured to receive the first voltage detection signal D_s1 and a drain coupled to the second node N_B.

The fourth transistor N2 may have a gate configured to receive the second voltage VDD, a drain coupled to the source of the third transistor N1, and a source coupled to the ground terminal VSS.

When the first voltage detection signal D_s1 is disabled, the second current source circuit 123 may raise the voltage level of the second node N_B by supplying a current to the second node N_B.

The second current source circuit 123 may include a fifth transistor P3.

The fifth transistor P3 may have a gate configured to receive the first voltage detection signal D_s1, a source configured to receive the first voltage VCCQ, and a drain coupled to the second node N_B.

When the current control signal I_c is enabled, the third current source circuit 124 may lower the voltage level of the second node N_B by passing the current of the second node N_B to the ground terminal VSS.

The third current source circuit 124 may include a sixth transistor N3.

The sixth transistor N3 may have a gate configured to receive the current control signal I_c, a drain coupled to the second node N_B, and a source configured to receive the first voltage VCCQ.

The fourth capacitor C4 may have one terminal configured to receive the first voltage VCCQ and the other terminal coupled to the second node N_B.

The third inverter IV3 may invert the voltage level of the second node N_B and output the inverted voltage level as the second voltage detection signal D_s2. The third inverter IV3 may have an input terminal coupled to the second node N_B and an output terminal configured to output the second voltage detection signal D_s2. Therefore, the second node N_B may serve as an input node of the third inverter IV3.

Figure 5:
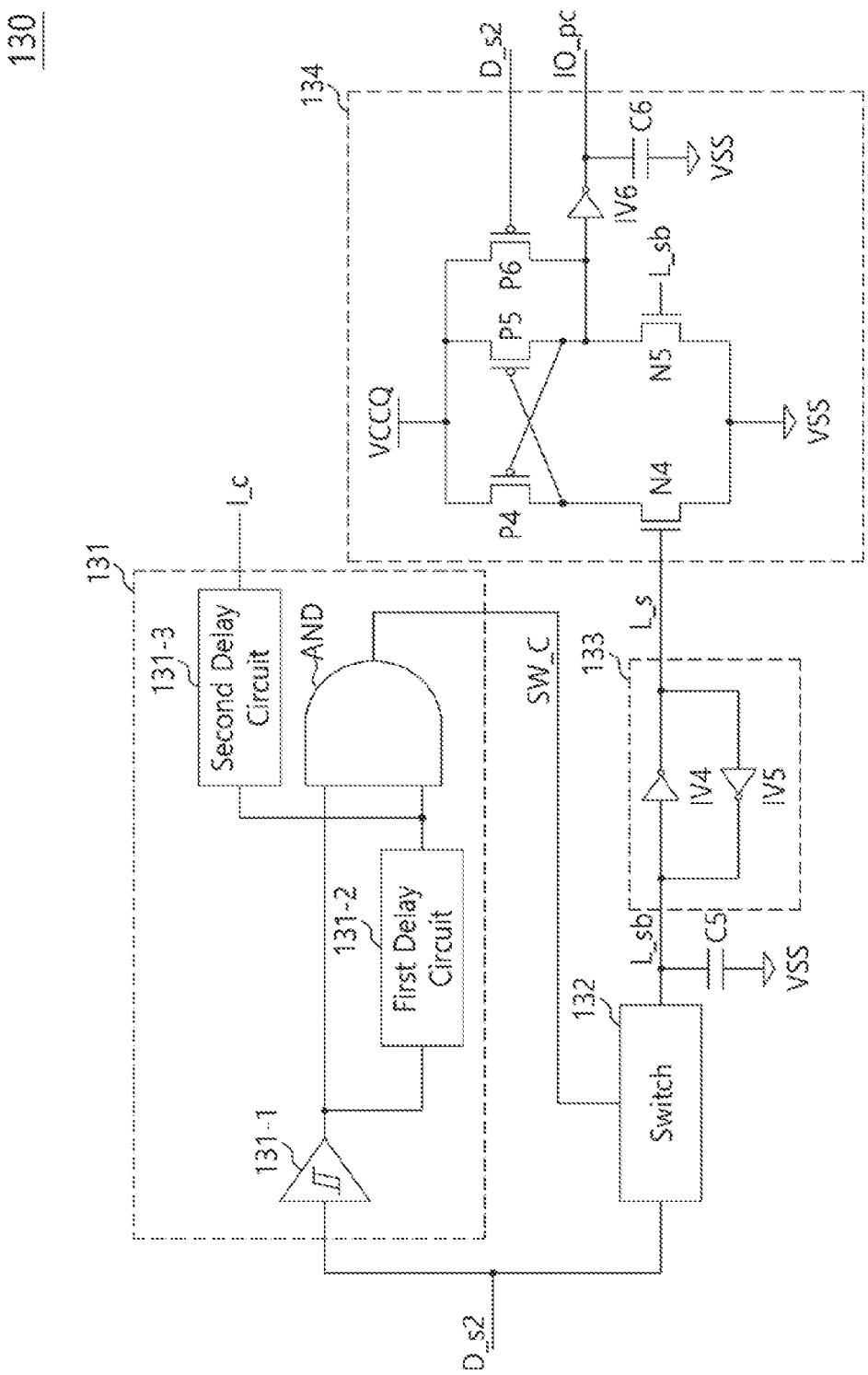
FIG. 5 is a configuration diagram illustrating a storage and output circuit of FIG. 2.

FIG. 5 is a configuration diagram illustrating the storage and output circuit 130 of FIG. 2.

As illustrated in FIG. 5, the storage and output circuit 130 may include a control signal generation circuit 131, a switch 132, a latch circuit 133, a fifth capacitor C5 and a power control signal output circuit 134.

The control signal generation circuit 131 may enable a switch control signal SW_c and the current control signal I_c when the second voltage detection signal D_s2 is enabled. For example, when the second voltage detection signal D_s2 is enabled, the control signal generation circuit 131 may enable the switch control signal SW_c for a preset time. Furthermore, the control signal generation circuit 131 may enable the current control signal I_c when the second voltage detection signal D_s2 is enabled, and disable the current control signal I_c when the second voltage detection signal D_s2 is disabled. When enabled by the second voltage detection signal D_s2, the switch control signal SW_c may be disabled after retaining the enabled state for the preset time.

The word "preset" as used herein with respect to a parameter, such as a preset time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The control signal generation circuit 131 may include a Schmitt trigger circuit 131-1, a first delay circuit 131-2, and a second delay circuit 131-3. The control signal generation circuit 131 may also be configured to perform an AND operation. For example, control signal generation circuit 131 may include an AND gate AND.

The Schmitt trigger circuit 131-1 may generate a high-level output signal when the voltage level of the second voltage detection signal D_s2 becomes higher than a preset voltage level or the second voltage detection signal D_s2 is enabled at a high level. On the other hand, the Schmitt trigger circuit 131-1 may generate a low-level output signal when the voltage level of the second voltage detection signal D_s2 becomes lower than the preset voltage level or the second voltage detection signal D_s2 is disabled at a low level.

The first delay circuit 131-2 may delay and invert the output signal of the Schmitt trigger circuit 131-1, and output the delayed and inverted signal.

The second delay circuit 131-3 may delay and invert the output signal of the first delay circuit 131-2, and output the delayed and inverted signal as the current control signal I_c.

The AND gate AND may receive the output signals of the Schmitt trigger circuit 131-1 and the first delay circuit 131-2, and generate the switch control signal SW_c. For example, the AND gate AND may generate the switch control signal SW_c which is enabled at a high level only during a period in which both of the output signals of the Schmitt trigger circuit 131-1 and the first delay circuit 131-2 are at a high level. At this time, the enable period of the switch control signal SW_c may be equal to the delay time of the first delay circuit 131-2.

When the switch control signal SW_c is enabled, the switch 132 may output the second voltage detection signal D_s2 as a latch inversion signal L_sb. On the other hand, when the switch control signal SW_c is disabled, the switch 132 may stop the operation of outputting the second voltage detection signal D_s2 as the latch inversion signal L_sb.

The latch circuit 133 may latch and invert the latch inversion signal L_sb, and output the latched and inverted signal as a latch signal L_s.

The latch circuit 133 may be configured to perform a fourth and fifth inversion operation. For example, the latch circuit 133 may include fourth and fifth inverters IV4 and IV5.

The fourth inverter IV4 may receive the latch inversion signal L_sb, invert the received signal, and output the inverted signal as the latch signal L_s.

The fifth inverter IV5 may receive the output signal of the fourth inverter IV4, invert the received signal, and output the inverted signal as an input signal of the fourth inverter IV4.

At this time, the fifth capacitor C5 may be coupled to a node to which the switch 132 and the latch circuit 133 are coupled. The fifth capacitor C5 may have one terminal coupled to the node to which the switch 132 and the latch circuit 133 are coupled and the other terminal coupled to the ground terminal VSS. The switch 132 may transfer the second voltage detection signal D_s2 to the latch circuit 133 when the switch control signal SW_c is enabled, and electrically separate the second voltage detection signal D_s2 from the latch circuit 133 when the switch control signal SW_c is disabled.

The power control signal output circuit 134 may be configured to perform a sixth inversion operation. For example, the power control signal output circuit 134 may include seventh to 11th transistors N4, N5 and P4 to P6, a sixth inverter IV6 and a sixth capacitor C6.

The seventh transistor N4 may have a gate configured to receive the latch signal L_s and a source coupled to the ground terminal VSS.

The eighth transistor N5 may have a gate configured to receive the latch inversion signal L_sb and a source coupled to the ground terminal VSS.

The ninth transistor P4 may have a gate coupled to the drain of the eighth transistor N5, a source configured to receive the first voltage VCCQ, and a drain coupled to the drain of the seventh transistor N4.

The tenth transistor P5 may have a gate coupled to the drain of the seventh transistor N4, a source configured to receive the first voltage VCCQ, and a drain coupled to the drain of the eighth transistor N5.

The 11th transistor P6 may have a gate configured to receive the second voltage detection signal D_s2, a source configured to receive the first voltage VCCQ, and a drain coupled to a node to which the eighth and tenth transistors N5 and P5 are coupled in common.

The sixth inverter IV6 may have an input terminal coupled to a node to which the eighth, tenth and 11th transistors N5, P5 and P6 are coupled in common, and an output terminal configured to output the power control signal IO_pc.

The sixth capacitor C6 may have one terminal coupled to the output terminal of the sixth inverter IV6 and the other terminal coupled to the ground terminal VSS.

Referring to FIGS. 2 to 6, the semiconductor apparatus having the above-described configuration in accordance with the present embodiment will be described as follows.

Referring to FIG. 3, the operation of the first voltage detection circuit 110 will be described.

When the voltage level of the first voltage VCCQ becomes higher than the first set voltage level, the first transistor P1 may be turned on to raise the voltage level of the first node N_A. The voltage level of the first node N_A may be outputted as the first voltage detection signal D_s1 through the first and second inverters IV1 and IV2.

Consequently, when the voltage level of the first voltage VCCQ becomes higher than the first set voltage level, the first voltage detection circuit 110 may enable the first voltage detection signal D_s1 at a high level.

Referring to FIG. 4, the operation of the second voltage detection circuit 120 will be described.

When the current control signal I_c is disabled at a low level, the first current source circuit 121 may raise the voltage level of the second node N_B by supplying a current to the second node N_B.

When the first voltage detection signal D_s1 is enabled at a high level and the voltage level of the second voltage VDD becomes higher than the second set voltage level, the first current sink circuit 122 may lower the voltage level of the second node N_B by passing the current of the second node N_B to the ground terminal VSS.

When the first voltage detection signal D_s1 is disabled at a low level, the second current source circuit 123 may raise the voltage level of the second node N_B by supplying a current to the second node N_B.

When the current control signal I_c is enabled at a high level, the third current source circuit 124 may raise the voltage level of the second node N_B by supplying a current to the second node N_B.

The third inverter IV3 may invert the voltage level of the second node N_B and output the inverted voltage level as the second voltage detection signal D_s2.

Consequently, when the first voltage detection signal D_s1 is enabled at a high level and the voltage level of the second set voltage VDD becomes higher than the second set voltage level, the second voltage detection circuit 120 may enable the second voltage detection signal D_s2 at a high level. On the other hand, when the first voltage detection signal D_s1 is disabled at a low level or the current control signal I_c is enabled at a high level, the second voltage detection circuit 120 may disable the second voltage detection signal D_s2 at a low level.

Referring to FIG. 5, the operation of the storage and output circuit 130 will be described.

The second voltage detection signal D_s2 may be delayed by the delay times of the first and second delay circuits 131-2 and 131-3, and outputted as the current control signal I_c.

When the second voltage detection signal D_s2 is enabled, the switch control signal SW_c having an enable period corresponding to the delay time of the first delay circuit 131-2 may be generated.

During the enable period of the switch control signal SW_c, the second voltage detection signal D_s2 may be inputted to the latch circuit 133.

The latch circuit 133 may latch the second voltage detection signal D_s2, and output the latched signal as the latch signal L_s and the latch inversion signal L_sb. At this time, the latch signal L_s and the latch inversion signal L_sb may have levels opposite to each other.

When the latch signal L_s is enabled at a high level, the power control signal output circuit 134 may output the power control signal IO_pc which is disabled at a low level. On the other hand, when the latch signal L_s is disabled at a low level, the power control signal output circuit 134 may output the power control signal IO_pc which is enabled at a high level. Furthermore, when the second voltage detection signal D_s2 is disabled at a low level, the power control signal output circuit 134 may output the power control signal IO_pc which is disabled at a low level.

Consequently, when the second voltage detection signal D_s2 is enabled at a high level, the storage and output circuit 130 may output the current control signal I_c and the power control signal IO_pc which are enabled at a high level. When the second voltage detection signal D_s2 is disabled at a low level, the storage and output circuit 130 may output the current control signal I_c and the power control signal IO_pc which are disabled at a low level.

Figure 6:
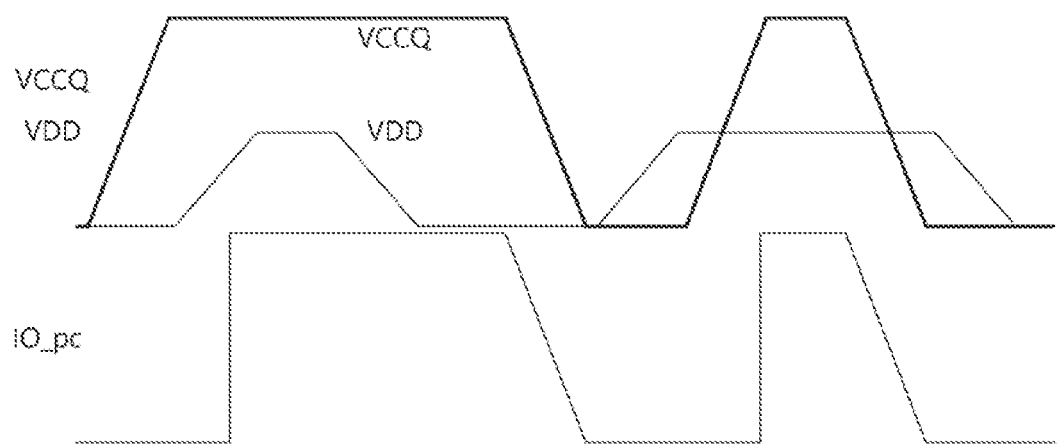
FIG. 6 is a timing diagram for describing an operation of the control circuit of FIG. 2.

The control circuit 100 including the first voltage detection circuit 110, the second voltage detection circuit 120 and the storage and output circuit 130, which operate as described above, may enable the power control signal IO_pc at a high level, when the first voltage VCCQ becomes higher than the first set voltage level and the second voltage VDD becomes higher than the second set voltage level as illustrated in a timing diagram of FIG. 6. On the other hand, when the voltage level of the first voltage VCCQ becomes lower than the first set voltage level, the control circuit 100 may disable the power control signal IO_pc at a low level.

The data input/output circuits 200 of FIG. 1 may be activated only in the enable period of the power control signal IO_pc, and input/output data.

Figure 7:
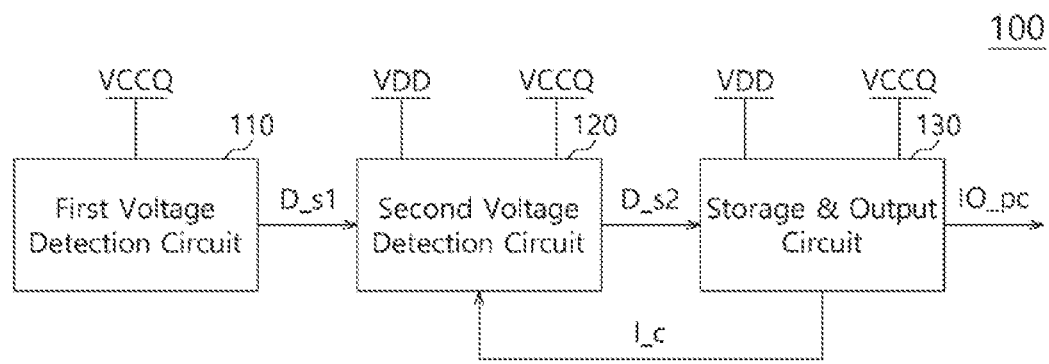
FIG. 7 is a configuration diagram illustrating a control circuit in accordance with another embodiment of FIG. 1.

FIG. 7 is a configuration diagram illustrating one control circuit 100 among the plurality of control circuits 100 illustrated in FIG. 1, showing a different embodiment from the control circuit of FIG. 2.

As illustrated in FIG. 7, the control circuit 100 may include a first voltage detection circuit 110, a second voltage detection circuit 120 and a storage and output circuit 130.

The first voltage detection circuit 110 may generate a first voltage detection signal D_s1 in response to the voltage level of a first voltage VCCQ. For example, the first voltage detection circuit 110 may enable the first voltage detection signal D_s1 at a high level when the voltage level of the first voltage VCCQ becomes equal to or higher than a first set voltage level. On the other hand, when the voltage level of the first voltage VCCQ is lower than the first set voltage level, the first voltage detection circuit 110 may disable the first voltage detection signal D_s1 at a low level.

The second voltage detection circuit 120 may generate the second voltage detection signal D_s2 in response to the first voltage detection signal D_s1, the current control signal I_c and the first and second voltages VCCQ and VDD. For example, when the first voltage detection signal D_s1 is enabled and the voltage level of the second voltage VDD becomes equal to or higher than a second set voltage level, the second voltage detection circuit 120 may enable the second voltage detection signal D_s2 at a high level. On the other hand, when the first voltage detection signal D_s1 is disabled, the second voltage detection circuit 120 may disable the second voltage detection signal D_s2 at a low level. When the second voltage VDD is equal to or lower than a preset voltage level, the second voltage detection circuit 120 may disable the second voltage detection signal D_s2 at a low level. Furthermore, when the current control signal I_c is enabled at a high level, the second voltage detection circuit 120 can reduce power or current consumption thereof.

The storage and output circuit 130 may generate the power control signal IO_pc in response to the second voltage detection signal D_s2 and the voltage level of the second voltage VDD. For example, when the second voltage detection signal D_s2 is enabled and the voltage level of the second voltage VDD is higher than the preset voltage level, the storage and output circuit 130 may enable the current control signal I_c, latch the enabled second voltage detection signal D_s2, and output the latched signal as the power control signal IO_pc. On the other hand, when the second voltage detection signal D_s2 is disabled or the voltage level of the second voltage VDD becomes lower than the preset voltage level, the storage and output circuit 130 may disable the current control signal I_c and disable the power control signal IO_pc at a low level.

At this time, the first voltage VCCQ may be supplied to the plurality of data input/output circuits 200 of FIG. 1, and the second voltage VDD may be supplied to the core circuit 300 of FIG. 1. The power control signal IO_pc may be inputted to the plurality of data input/output circuits 200. The plurality of data input/output circuits 200 may be activated when the power control signal IO_pc is enabled, and deactivated when the power control signal IO_pc is disabled.

Since the first voltage detection circuit 110 of FIG. 7 can be configured in the same manner as the first voltage detection circuit 110 of FIG. 2, the description for the configuration of the first voltage detection circuit 110 of FIG. 7 may be replaced with the description for the configuration of the first voltage detection circuit 110 of FIG. 2.

Figure 8:
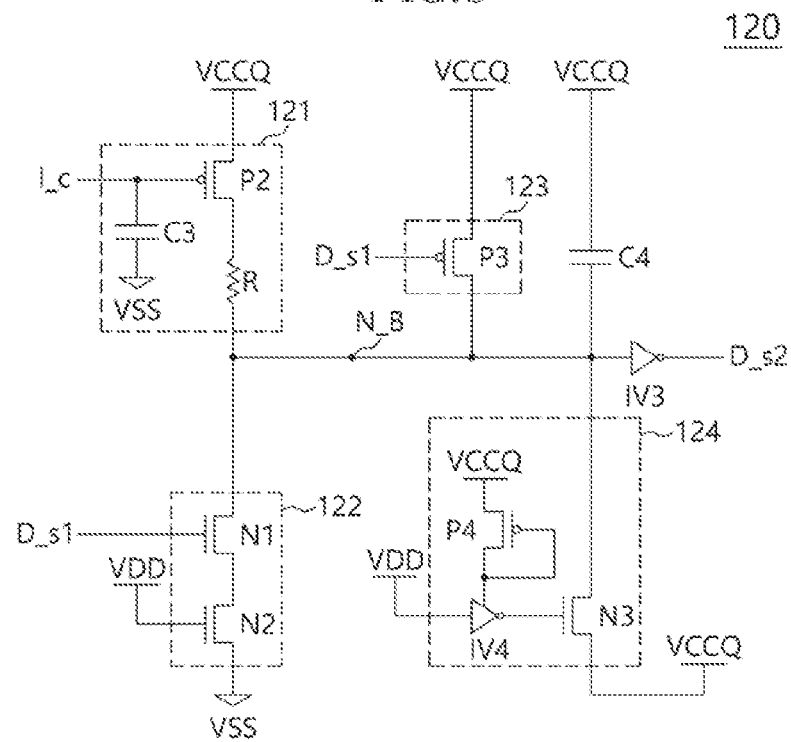
FIG. 8 is a configuration diagram illustrating a second voltage detection circuit of FIG. 7.

FIG. 8 is a configuration diagram illustrating the second voltage detection circuit 120 of FIG. 7.

As illustrated in FIG. 8, the second voltage detection circuit 120 may include a first current source circuit 121, a first current sink circuit 122, a second current source circuit 123, a third current source circuit 124, a third capacitor C3 and a third inverter IV3.

The first current source circuit 121 may supply a current to the second node N_B in response to the current control signal I_c. For example, when the current control signal I_c is disabled at a low level, the first current source circuit 121 may raise the voltage level of the second node N_B by supplying a current to the second node N_B. On the other hand, when the current control signal I_c is enabled at a high level, the first current source circuit 121 may stop supplying the current to the second node N_B.

The first current source circuit 121 may include a third capacitor C3, a second transistor P2 and a resistor R.

The third capacitor C3 may have one terminal coupled to a gate of the second transistor P2 and the other terminal coupled to a ground terminal VSS.

The second transistor P2 may have the gate configured to receive the current control signal I_c, a source configured to receive the first voltage VCCQ, and a drain coupled to one terminal of the resistor R.

The resistor R may have the one terminal coupled to the drain of the second transistor P2 and the other terminal coupled to the second node N_B.

When the first voltage detection signal D_s1 is enabled and the voltage level of the second voltage VDD becomes equal to or higher than the second set voltage level, the first current sink circuit 122 may lower the voltage level of the second node N_B by passing the current of the second node N_B to the ground terminal VSS.

The first current sink circuit 122 may include third and fourth transistors N1 and N2.

The third transistor N1 may have a gate configured to receive the first voltage detection signal D_s1 and a drain coupled to the second node N_B.

The fourth transistor N2 may have a gate configured to receive the second voltage VDD, a drain coupled to the source of the third transistor N1, and a source coupled to the ground terminal VSS.

When the first voltage detection signal D_s1 is disabled, the second current source circuit 123 may raise the voltage level of the second node N_B by supplying a current to the second node N_B.

The second current source circuit 123 may include a fifth transistor P3.

The fifth transistor P3 may have a gate configured to receive the first voltage detection signal D_s1, a source configured to receive the first voltage VCCQ, and a drain coupled to the second node N_B.

When the voltage level of the first voltage VCCQ becomes higher than the first set voltage level and the voltage level of the second voltage VDD is lower than the second set voltage level, the third current source circuit 124 may raise the voltage level of the second node N_B by applying a current to the second node N_B. When the voltage level of the second voltage VDD is higher than the second set voltage level, the third current source circuit 124 may interrupt the current applied to the second node N_B.

The third current source circuit 124 may be configured to perform a fourth inversion operation. For example, the third current source circuit 124 may include a sixth transistor N3, a seventh transistor P4 and a fourth inverter IV4.

The sixth transistor N3 may have a gate configured to receive an output signal of the fourth inverter IV4, a drain coupled to the second node N_B, and a source configured to receive the first voltage VCCQ.

The seventh transistor P4 may have a source configured to receive the first voltage VCCQ and a gate and drain coupled in common.

The fourth inverter IV4 may have an input terminal configured to receive the second voltage VDD and a voltage terminal coupled to the drain of the seventh transistor P4.

The fourth capacitor C4 may have one terminal configured to receive the first voltage VCCQ and the other terminal coupled to the second node N_B.

The third inverter IV3 may invert the voltage level of the second node N_B and output the inverted voltage level as the second voltage detection signal D_s2. The third inverter IV3 may have an input terminal coupled to the second node N_B and an output terminal configured to output the second voltage detection signal D_s2.

Figure 9:
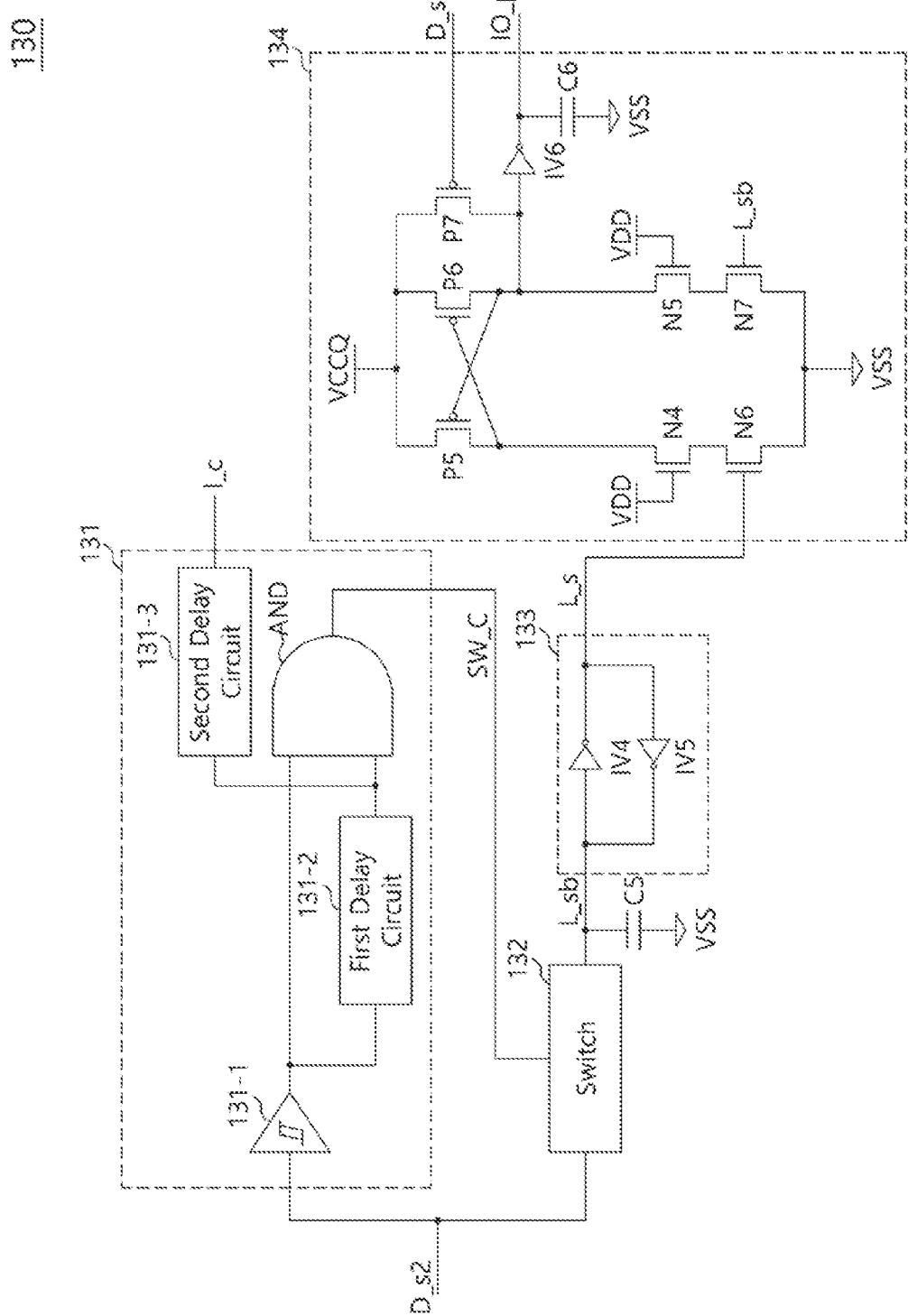
FIG. 9 is a configuration diagram illustrating a storage and output circuit of FIG. 7.

FIG. 9 is a configuration diagram illustrating the storage and output circuit 130 of FIG. 7.

As illustrated in FIG. 9, the storage and output circuit 130 may include a control signal generation circuit 131, a switch 132, a latch circuit 133, a fifth capacitor C5 and a power control signal output circuit 134.

When the second voltage detection signal D_s2 is enabled, the control signal generation circuit 131 may enable a switch control signal SW_c and the current control signal I_c. For example, when the second voltage detection signal D_s2 is enabled, the control signal generation circuit 131 may enable the switch control signal SW_c for a preset time. Furthermore, the control signal generation circuit 131 may enable the current control signal I_c when the second voltage detection signal D_s2 is enabled, and disable the current control signal I_c when the second voltage detection signal D_s2 is disabled. When enabled by the second voltage detection signal D_s2, the switch control signal SW_c may be disabled after retaining the enabled state for the preset time.

The control signal generation circuit 131 may include a Schmitt trigger circuit 131-1, a first delay circuit 131-2, and a second delay circuit 131-2. The control signal generation circuit 131 may also be configured to perform an AND operation. For example, control signal generation circuit 131 may include an AND gate AND.

The Schmitt trigger circuit 131-1 may generate a high-level output signal when the voltage level of the second voltage detection signal D_s2 becomes higher than a preset voltage level or the second voltage detection signal D_s2 is enabled at a high level. On the other hand, the Schmitt trigger circuit 131-1 may generate a low-level output signal when the voltage level of the second voltage detection signal D_s2 becomes lower than the preset voltage level or the second voltage detection signal D_s2 is disabled at a low level.

The first delay circuit 131-2 may delay and invert the output signal of the Schmitt trigger circuit 131-1, and output the delayed and inverted signal.

The second delay circuit 131-3 may delay and invert the output signal of the first delay circuit 131-2, and output the delayed and inverted signal as the current control signal I_c.

The AND gate AND may receive the output signals of the Schmitt trigger circuit 131-1 and the first delay circuit 131-2, and generate the switch control signal SW_c. For example, the AND gate AND may generate the switch control signal SW_c which is enabled at a high level only during a period in which both of the output signals of the Schmitt trigger circuit 131-1 and the first delay circuit 131-2 are at a high level. At this time, the enable period of the switch control signal SW_c may be equal to the delay time of the first delay circuit 131-2.

When the switch control signal SW_c is enabled, the switch 132 may output the second voltage detection signal D_s2 as a latch inversion signal L_sb. On the other hand, when the switch control signal SW_c is disabled, the switch 132 may stop the operation of outputting the second voltage detection signal D_s2 as the latch inversion signal L_sb.

The latch circuit 133 may latch and invert the latch inversion signal L_sb, and output the latched and inverted signal as a latch signal L_s.

The latch circuit 133 may be configured to perform a fourth and fifth inversion operation. For example, the latch circuit 133 may include fourth and fifth inverters IV4 and IV5.

The fourth inverter IV4 may receive the latch inversion signal L_sb, invert the received signal, and output the inverted signal as the latch signal L_s.

The fifth inverter IV5 may receive the output signal of the fourth inverter IV4, invert the received signal, and input the inverted signal as an input signal of the fourth inverter IV4.

At this time, the fifth capacitor C5 may be coupled to a node to which the switch 132 and the latch circuit 133 are coupled. The fifth capacitor C5 may have one terminal coupled to the node to which the switch 132 and the latch circuit 133 are coupled and the other terminal coupled to the ground terminal VSS. The switch 132 may transfer the second voltage detection signal D_s2 to the latch circuit 133 when the switch control signal SW_c is enabled, and electrically separate the second voltage detection signal D_s2 from the latch circuit 133 when the switch control signal SW_c is disabled.

The power control signal output circuit 134 may be configured to perform a sixth inversion operation. For example, the power control signal output circuit 134 may include eighth to 14th transistors N4 to N7 and P4 to P6, a sixth inverter IV6 and a sixth capacitor C6.

The eighth transistor N4 may have a gate configured to receive the second voltage VDD.

The ninth transistor N5 may have a gate configured to receive the second voltage VDD.

The tenth transistor N6 may have a gate configured to receive the latch signal Ls, a source coupled to the ground terminal VSS, and a drain coupled to the source of the eighth transistor N4.

The eleventh transistor N7 may have a gate configured to receive the latch inversion signal L_sb, a source coupled to the ground terminal VSS, and a drain coupled to the source of the ninth transistor N5.

The twelfth transistor P5 may have a gate coupled to the drain of the ninth transistor N5, a source configured to receive the first voltage VCCQ, and a drain coupled to the drain of the eighth transistor N4.

The thirteenth transistor P6 may have a gate coupled to the drain of the eighth transistor N4, a source configured to receive the first voltage VCCQ, and a drain coupled to the drain of the ninth transistor N5.

The fourteenth transistor P7 may have a gate configured to receive the second voltage detection signal D_s2, a source configured to receive the first voltage VCCQ, and a drain coupled to a node to which the ninth and 13th transistors N5 and P6 are coupled in common.

The sixth inverter IV6 may have an input terminal coupled to a node to which the ninth, 13th and 14th transistors N5, P6 and P7 are coupled in common, and an output terminal configured to output the power control signal IO_pc.

The sixth capacitor C6 may have one terminal coupled to the output terminal of the sixth inverter IV6 and the other terminal coupled to the ground terminal VSS.

Referring to FIGS. 7 to 10, the semiconductor apparatus having the above-described configuration in accordance with the present embodiment will be described as follows.

Referring to FIG. 3, the operation of the first voltage detection circuit 110 will be described.

When the voltage level of the first voltage VCCQ becomes higher than the first set voltage level, the first transistor P1 may be turned on to raise the voltage level of the first node N_A. The voltage level of the first node N_A may be outputted as the first voltage detection signal D_s1 through the first and second inverters IV and IV2.

Consequently, when the voltage level of the first voltage VCCQ becomes higher than the first set voltage level, the first voltage detection circuit 110 may enable the first voltage detection signal D_s1 at a high level.

Referring to FIG. 8, the operation of the second voltage detection circuit 120 will be described.

When the current control signal I_c is disabled at a low level, the first current source circuit 121 may raise the voltage level of the second node N_B by supplying a current to the second node N_B.

When the first voltage detection signal D_s1 is enabled at a high level and the voltage level of the second voltage VDD becomes higher than the second set voltage level, the first current sink circuit 122 may lower the voltage level of the second node N_B by passing the current of the second node N_B to the ground terminal VSS.

When the first voltage detection signal D_s1 is disabled at a low level, the second current source circuit 123 may raise the voltage level of the second node N_B by supplying a current to the second node N_B.

When the voltage level of the first voltage VCCQ becomes higher than the first set voltage level and the voltage level of the second voltage VDD becomes lower than the second set voltage level, the third current source circuit 124 may raise the voltage level of the second node N_B by applying a current to the second node N_B. When the voltage level of the second voltage VDD becomes higher than the second set voltage level, the third current source circuit 124 may interrupt the current applied to the second node N_B.

The third inverter IV3 may invert the voltage level of the second node N_B and output the inverted voltage level as the second voltage detection signal D_s2.

Consequently, when the first voltage detection signal D_s1 is enabled at a high level and the voltage level of the second voltage VDD becomes higher than the second set voltage level, the second voltage detection circuit 120 may enable the second voltage detection signal D_s2 at a high level. On the other hand, when the first voltage detection signal D_s1 is disabled at a low level or the current control signal I_c is disabled at a low level, the second voltage detection circuit 120 may disable the second voltage detection signal D_s2 at a low level.

Referring to FIG. 9, the operation of the storage and output circuit 130 will be described.

The second voltage detection signal D_s2 may be delayed by the delay times of the first and second delay circuits 131-2 and 131-3, and outputted as the current control signal I_c.

When the second voltage detection signal D_s2 is enabled, the switch control signal SW_c having an enable period corresponding to the delay time of the first delay circuit 131-2 may be generated.

During the enable period of the switch control signal SW_c, the second voltage detection signal D_s2 may be inputted to the latch circuit 133.

The latch circuit 133 may latch the second voltage detection signal D_s2, and output the latched signal as the latch signal L_s and the latch inversion signal L_sb. At this time, the latch signal L_s and the latch inversion signal L_sb may have levels opposite to each other.

When the latch signal L_s is enabled at a high level or the second voltage VDD becomes lower than the preset voltage level, the power control signal output circuit 134 may output the power control signal IO_pc which is disabled at a low level. On the other hand, when the latch signal L_s is disabled at a low level or the second voltage VDD becomes higher than the preset voltage level, the power control signal output circuit 134 may output the power control signal IO_pc which is enabled at a high level. Furthermore, when the 25 second voltage detection signal D_s2 is disabled at a low level, the power control signal output circuit 134 may output the power control signal IO_pc which is disabled at a low level.

Consequently, when the second voltage VDD is higher than the preset voltage level and the second voltage detection signal D_s2 is enabled at a high level, the storage and output circuit 130 may output the current control signal I_c and the power control signal IO_pc which are enabled at a high level. When the second voltage detection signal D_s2 is disabled at a low level or the second voltage VDD is lower than the preset voltage level, the storage and output circuit 130 may output the current control signal I_c and the power control signal IO_pc which are disabled at a low level.

Figure 10:
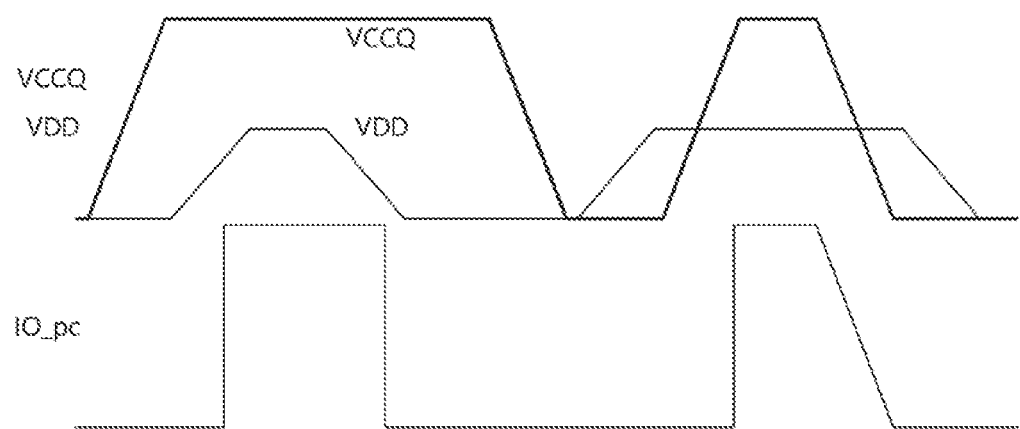
FIG. 10 is a timing diagram for describing an operation of the control circuit of FIG. 7.

The control circuit 100 including the first voltage detection circuit 110, the second voltage detection circuit 120 and the storage and output circuit 130, which operate as described above, may enable the power control signal IO_pc at a high level, when the first voltage VCCQ becomes higher than the first set voltage level and the second voltage VDD becomes higher than the second set voltage level as illustrated in the timing diagram of FIG. 10. On the other hand, when the voltage level of the first voltage VCCQ becomes lower than the first set voltage level or the second voltage VDD becomes lower than the second set voltage level, the control circuit 100 may disable the power control signal IO_pc at a low level.

The data input/output circuits 200 of FIG. 1 may be activated only in the enable period of the power control signal IO_pc, and input/output data.

The control circuit illustrated in FIGS. 2 and 3 may activate the data input/output circuits only when both of the first and second voltages become higher than the set voltage levels. The control circuit of FIG. 2 may deactivate the data input/output circuit when the first voltage becomes lower than the preset voltage level, and the control circuit of FIG. 3 may deactivate the data input/output circuit when any one of the first and second voltages becomes lower than the preset voltage level.

The semiconductor apparatus in accordance with the present embodiment can reduce power consumption.

Figure 11:
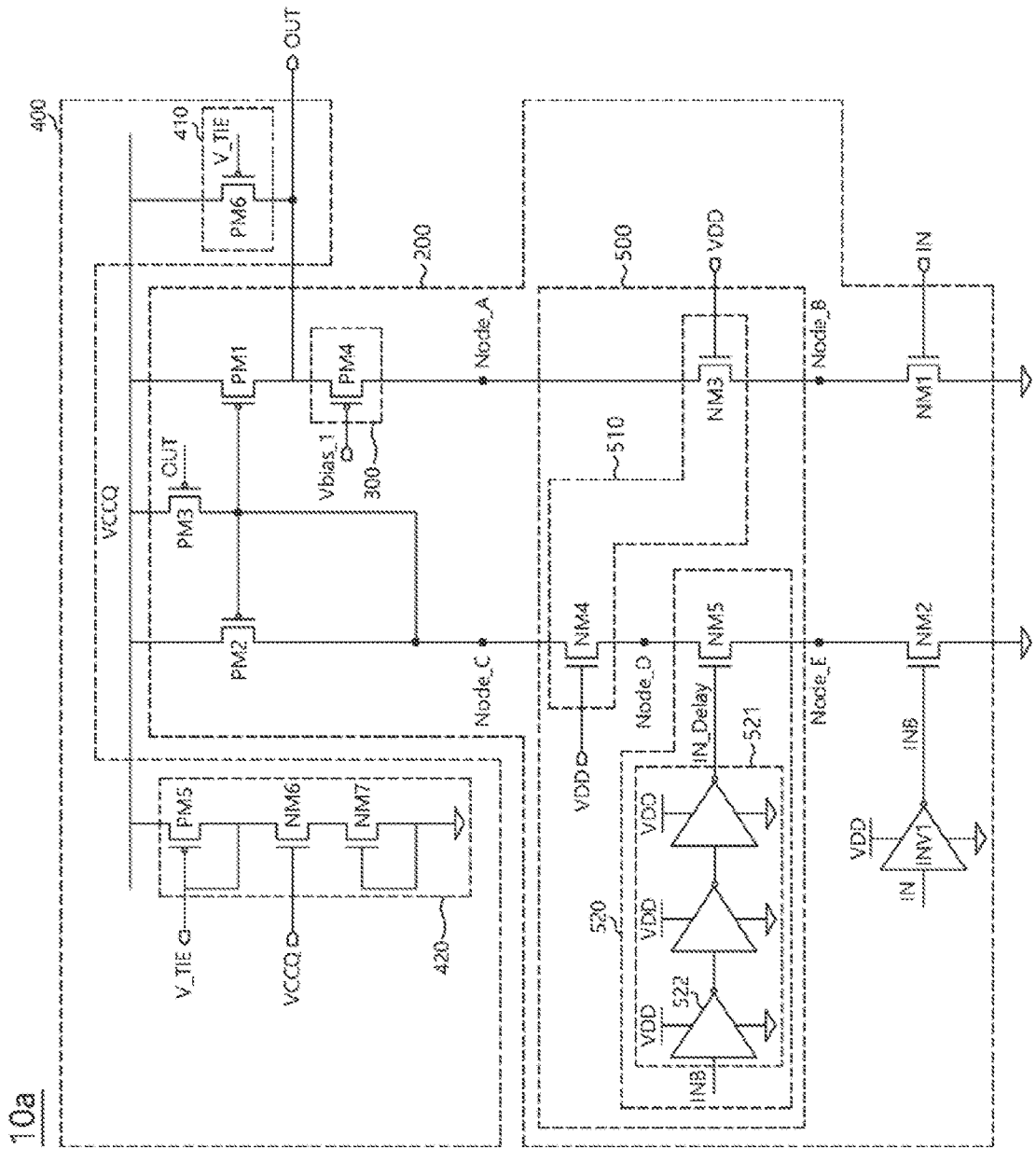
FIG. 11 is a diagram illustrating a configuration of a level shifter according to an embodiment of the present disclosure.

FIG. 11 is a diagram illustrating a configuration of a level shifter according to an embodiment of the present disclosure.

As illustrated in FIG. 11, a level shifter 10a according to an embodiment includes a current mirror 200, a first adjusting circuit 300, and a second adjusting circuit 400.

The level shifter 10a according to an embodiment may further include a third adjusting circuit 500.

All unit elements constituting the level shifter 10a according to an embodiment, for example, transistors may use a low operation voltage as compared with transistors in the related art and thus the transistors may be designed with a thin gate oxide element. Accordingly, the circuit dimension of the transistor may be reduced.

The current mirror 200 may receive an input signal IN in response to a first power voltage VCCQ and output an output signal OUT by mirroring a current corresponding to a second power voltage VDD based on a level of the input signal IN.

The second power voltage VDD may have a higher voltage level than the first power voltage VCCQ.

The current mirror 200 may include an inverter INV1 and a plurality of switching elements NM1, NM2, PM1, PM2, and PM3.

A first current path of the current mirror 200 may be formed by a plurality of switching elements PM1, PM4, NM3, and NM1.

A second current path of the current mirror 200 may be formed by a plurality of switching elements PM2, NM4, NM5, and NM2.

The first adjusting circuit 300 may be coupled to an output voltage OUT terminal of the current mirror 200 and configured to adjust a voltage level of the output voltage OUT terminal based on a first bias voltage Vbias_1.

The first adjusting circuit 300 may include a switching element PM4.

The second adjusting circuit 400 may be coupled to a second power voltage VDD terminal in parallel to the current mirror 200 and configured to adjust the voltage level of the output voltage OUT terminal of the current mirror 200.

The second adjusting circuit 400 may include an output voltage compensation unit 410 and a compensation voltage generation unit 420.

The output voltage compensation unit 410 may prevent the voltage level of the output voltage OUT terminal from being lowered less than a voltage level increased through the first adjusting circuit 300 in response to a compensation voltage V_TIE.

The compensation voltage generation unit 420 may be coupled to the second power voltage VDD terminal in parallel to the current mirror 200 and may generate the compensation voltage V_TIE.

The second adjusting circuit 400 may include a plurality of switching elements PM5, PM6, NM6, and NM7.

The third adjusting circuit 500 may be coupled to the first current path and the second current path of the current mirror 200 and configured to adjust voltage levels of the first current path and the second current path and to block a leakage current in the second current path.

The third adjusting circuit 500 may include a first adjusting unit 510 and a second adjusting unit 520.

The first adjusting unit 510 may adjust the voltage levels of the first current path and the second current path of the current mirror 200 in response to the first power voltage VCCQ.

The second adjusting unit 520 may block the leakage current of the second current path of the current mirror 200 in response to the inverted input signal INB.

The third adjusting circuit 500 may include a delay circuit 521 and a plurality of switching elements NM3, NM4, and NM5.

For example, when it is assumed that the first power voltage VCCQ is 0.8 V and the second power voltage VDD is 1.2 V, node voltage differences Vds, Vgs, and Vg have to be maintained, for example, to 1.06 V or below even in any operation condition to guarantee the reliability of all elements constituting the level shifter 10a.

Accordingly, the level shifter 10a according to an embodiment may be designed to satisfy the above-described node voltage difference condition by constituting the first adjusting circuit 300 and the second adjusting circuit 400 and may improve stability and leakage current preventing capacity by additionally constituting the third adjusting circuit 500.

One terminal of a first switching element NM1 may be coupled to a ground terminal, the other terminal thereof may be coupled to a node Node_B, and a control terminal thereof may receive the input signal IN.

One terminals of the plurality of switching elements NM1, NM2, PM1, PM2, and PM3 may be sources or drains, the other terminals thereof may be drains or sources, and control terminals thereof may be gates.

The inverter INV1 may generate an inverted input signal INB by inverting the input signal IN.

One terminal of a second switching element NM2 may be coupled to the ground terminal, the other terminal thereof may be coupled to a node Node_E, and a control terminal thereof may receive the inverted input signal INB.

One terminal of a third switching element PM1 may be coupled to the second power voltage VDD terminal and the other terminal thereof may be coupled to the output voltage OUT terminal.

One terminal of a fourth switching element PM2 may be coupled to the second power voltage VDD terminal and the other terminal thereof may be coupled to a node Node_C.

One terminal of a fifth switching element PM3 may be coupled to the second power voltage VDD terminal, the other terminal thereof may be commonly coupled to the control terminals of the third and fourth switching elements PM1 and PM2, and a control terminal thereof may receive the output voltage OUT.

One terminal of a sixth switching element PM4 may be coupled to the output voltage OUT terminal, the other terminal thereof may be coupled to a node Node_A, and a control terminal thereof may receive the first bias voltage Vbias_1.

The first bias voltage Vbias_1 may be, for example, 0.12V. In other embodiments, the first bias voltage Vbias_1 may be different from 0.12V.

Since the sixth switching element PM4 may receive the first bias voltage Vbias_1 through the control terminal (for example, the gate), the output voltage OUT may be set to have a variation range corresponding to a voltage range (for example, Vbias_1+Vth_PM4 to VCCQ) in an AC operation and may be set to be fixed to a voltage level (for example, Vbias_1+Vth_PM4 or VCCQ) in a DC operation. Accordingly, the above-described node voltage difference condition may be satisfied. Here, the "Vth_PM4" is a threshold voltage of the sixth switching element PM4.

One terminal of a seventh switching element PM6 may be coupled to the second power voltage VDD terminal, the other terminal thereof may be coupled to the output voltage OUT terminal, and a control terminal thereof may receive the compensation voltage V_TIE.

Eighth to tenth switching elements PM5, NM6, and NM7 may be coupled between the second power voltage VDD terminal and the ground voltage in series and may generate the compensation voltage V_TIE in response to the second power voltage VDD.

The current mirroring of the seventh switching element PM6 may be accomplished in response to the compensation voltage V_TIE generated through the eighth to tenth switching elements PM5, NM6, and NM7 and the current according to the current mirroring may be supplied to the output voltage OUT terminal.

Since the current is continuously supplied to the output voltage OUT terminal through the seventh switching element PM6, the output voltage OUT may be prevented from being lowered less than the voltage level of Vbias_1+Vth_PM4 even when the input signal IN of a high level is input to the control terminal of the first switching element NM1.

The seventh switching element PM6 may prevent the voltage level of the output voltage OUT from being lowered less than the voltage level of Vbias_1+Vth_PM4, and thus the operation reliability of the third switching element PM1 may be guaranteed.

One terminal of an eleventh switching element NM3 which is arranged in the first current path may be coupled to the node Node_A, the other terminal thereof may be coupled to the node Node_B, and a control terminal thereof may receive the first power voltage VCCQ.

Since the first power voltage VCCQ is applied to the control terminal of the eleventh switching element NM3, the eleventh switching element NM3 may drop the voltage of the node Node_B by the voltage level of VDD−Vth_NM3 (i.e., the voltage level of the first power voltage VCCQ minus the threshold voltage of the switching element NM3) and thus the operation reliability of the first switching element NM1 may be improved.

One terminal of a twelfth switching element NM4 which is arranged in the second current path may be coupled to the node Node_C, the other terminal thereof may be coupled to the node Node_D, and a control terminal thereof may receive the first power voltage VCCQ.

The twelfth switching element NM4 may also be operated in the same manner as the eleventh switching element NM3 and the operation reliability of a thirteenth switching element NM5 to be described later may be improved.

The delay circuit 521 may be configured of an inverter array 521 including a plurality of inverters 522.

The inverter array 521 may generate a delayed input signal IN_Delay by delaying and inverting the inverted input signal INB.

One terminal of the thirteenth switching element NM5 may be coupled to the node Node_D, the other terminal thereof may be coupled to the node Node_E, and a control terminal thereof may receive the delayed input signal IN_Delay.

The thirteenth switching element NM5 may operate with a time delay with respect to the second switching element NM2 in response to the delayed input signal IN_Delay and mitigate the current path from being formed beyond a certain time or more required for the level transition of the output voltage OUT terminal and thus the leakage current may be minimized.

Figure 12:
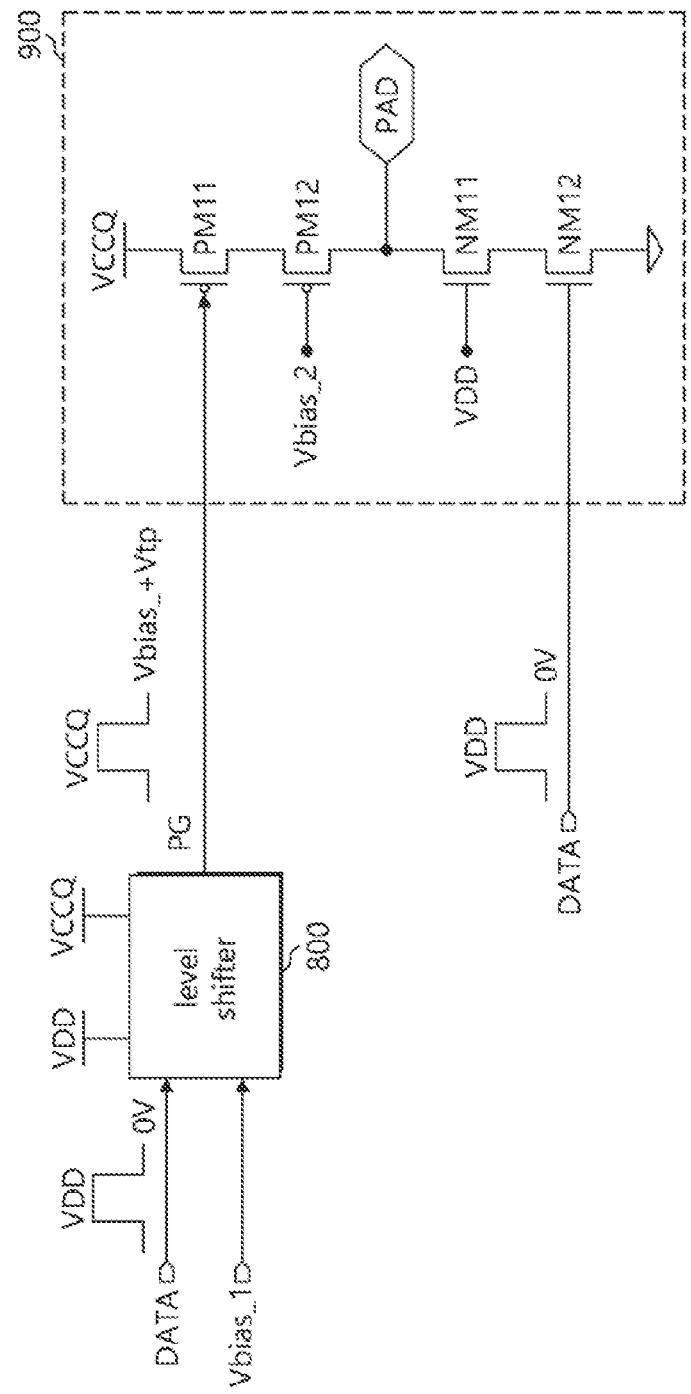
FIG. 12 is a diagram illustrating a configuration of a driver circuit according to an embodiment of the present disclosure.

FIG. 12 is a diagram illustrating a configuration of a driver circuit according to an embodiment of the present disclosure.

As illustrated in FIG. 12, a driver circuit 700 according to an embodiment may include a level shifter 800 and a pull-up/pull-down circuit 900.

The level shifter 800 may have the same configuration as that of the level shifter 10a of FIG. 11.

The level shifter 800 may receive data DATA provided from an external apparatus such as a memory controller, a host device, and the like using the first bias voltage Vbias_1, adjust a level variation range of the data DATA to a level suitable for an apparatus (for example, a semiconductor memory) which uses the data, and generate the level-adjusted data as an output signal PG.

The data DATA may have a voltage variation range (0 V~VDD) of from a ground voltage level to a first power voltage VCCQ level.

The output signal PG of the level shifter 800 may have a variation range corresponding to a voltage range of Vbias_1+Vtp~VCCQ.

The pull-up/pull-down circuit 900 may include a plurality of switching elements PM11, PM12, NM11, and NM12 coupled between the second power voltage VDD terminal and the ground voltage terminal in series.

The first switching element PM11 may receive the output signal PG of the level shifter 800 through a control terminal thereof.

The second switching element PM12 may receive a second bias voltage Vbias_2 through a control terminal thereof.

The first switching element PM11 and the second switching element PM12 may pull up a level of an output terminal PAD to a second power voltage VCCQ level.

The output terminal PAD may be an input/output (I/O) pad of the semiconductor memory.

The third switching element NM11 may receive the first power voltage VCCQ through a control terminal thereof.

The fourth switching element NM12 may receive the data DATA through a control terminal thereof.

The third switching element NM11 and the fourth switching element NM12 may pull down the level of the output terminal PAD to the ground voltage level.

As described above with reference to FIG. 12, the level shifter 800 may satisfy the node voltage difference conditions of all the elements constituting the level shifter 800 and thus the output voltage PG of the level shifter 800 may also have a variation range corresponding the voltage range of Vbias_1+Vtp~VCCQ. Accordingly, the high-speed operation of the first switching element PM11 which substantially conducts a driving operation of the driver circuit 700 may be accomplished and operation reliability of the first switching element PM11 may also be improved.

Figure 13:
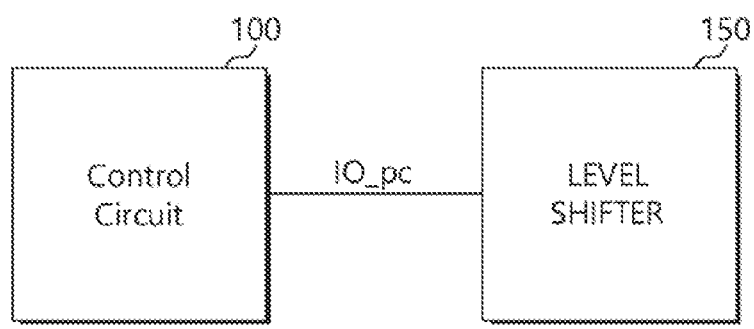
FIG. 13 is a block diagram illustrating a semiconductor apparatus in accordance with an embodiment.

FIG. 13 is a block diagram illustrating a semiconductor apparatus in accordance with an embodiment.

Referring to FIG. 13, the semiconductor apparatus 1000a may include a control circuit 100 and a level shifter 150.

The control circuit 100 may have the configurations of FIGS. 2 to 5 and/or FIGS. 7 to 9. As described above, the control circuit 100 may generate the power control signal IO_pc.

Figure 14:
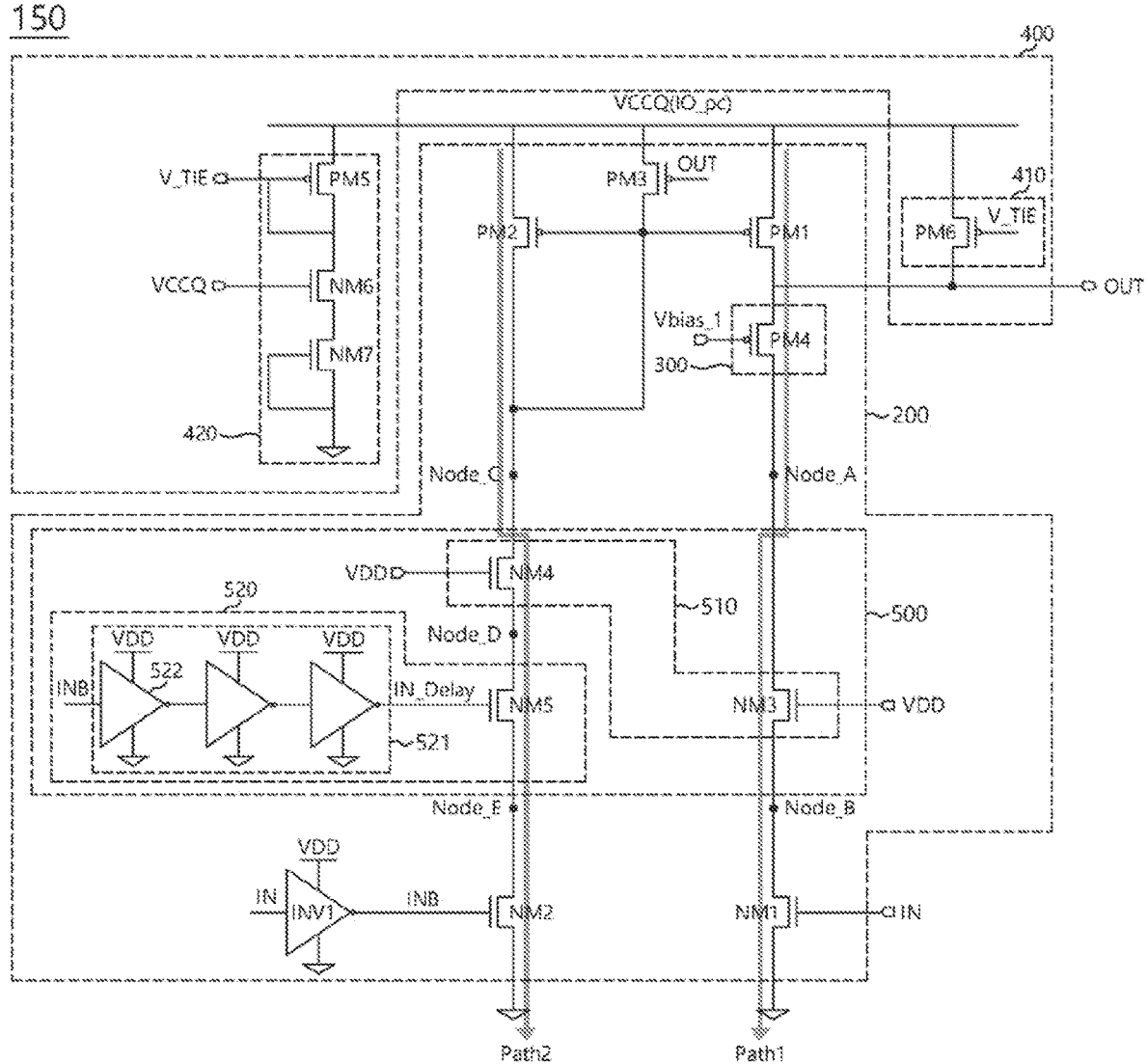
FIG. 14 is a circuit diagram illustrating a configuration of a level shifter of FIG. 13 in accordance with an embodiment.

FIG. 14 is a diagram illustrating a configuration of the level shifter of FIG. 13.

As illustrated in FIG. 14, a level shifter 150 according to an embodiment includes a current mirror 200, a first adjusting circuit 300, a second adjusting circuit 400 and a third adjusting circuit 500.

All unit elements constituting the level shifter 150 according to an embodiment, for example, transistors may use a low operation voltage as compared with transistors in the related art and thus the transistors may be designed with a thin gate oxide element. Accordingly, the circuit dimension of the transistor may be reduced. For example, a thick oxide transistor used for an existing level shifter has a gate length of 130 nm to 230 nm. However, a thin oxide transistor in accordance with the present embodiment may have a gate length of 16 nm to 32 nm.

The current mirror 200 may receive input signals IN and INB, a first voltage VCCQ and a second voltage VDD. The current mirror 200 may receive the input signals IN and INB in response to the second voltage VDD and output an output signal OUT by mirroring a current corresponding to the first voltage VCCQ based on a level of the input signal IN.

The first voltage VCCQ may have a higher voltage level than the second voltage VDD. For example, the first voltage VCCQ may receive the power control signal IO_pc.

The current mirror 200 may include an inverter INV1 and a plurality of switching elements NM1, NM2, PM1, PM2, and PM3. In the present embodiment, NM may represent an NMOS transistor, and PM may represent a PMOS transistor.

A first current path 'path 1' of the current mirror 200 may be formed by a plurality of switching elements PM1, PM4, NM3, and NM1.

A second current path 'path 2' of the current mirror 200 may be formed by a plurality of switching elements PM2, NM4, NM5, and NM2.

The first adjusting circuit 300 may be provided in the current mirror 200. The first adjusting circuit 300 may be coupled to an output voltage OUT terminal of the current mirror 200 and configured to adjust a voltage level of the output voltage OUT terminal based on a first bias voltage Vbias_1.

The first adjusting circuit 300 may include a switching element PM4.

The second adjusting circuit 400 may be coupled between the first voltage VCCQ terminal in parallel to the current mirror 200 and configured to adjust the voltage level of the output voltage OUT terminal of the current mirror 200.

The second adjusting circuit 400 may include an output voltage compensation unit 410 and a compensation voltage generation unit 420.

The output voltage compensation unit 410 may prevent a change of the voltage level of the output voltage OUT terminal. The output voltage compensation unit 410 may prevent the voltage level of the output voltage OUT terminal from being lowered less than a voltage level increased through the first adjusting circuit 300 in response to a compensation voltage V_TIE.

The compensation voltage generation unit 420 may be coupled to the first voltage VCCQ terminal in parallel to the current mirror 200 and may generate the compensation voltage V_TIE.

The second adjusting circuit 400 may include a plurality of switching elements PM5, PM6, NM6, and NM7.

The third adjusting circuit 500 may be coupled to the first current path 'path 1' and the second current path 'path 2' of the current mirror 200. The third adjusting circuit 500 may be configured to adjust voltage levels of the first current path 'path 1' and the second current path 'path 2' and to block a leakage current in the second current path 'path 2'.

The third adjusting circuit 500 may include a first adjusting unit 510 and a second adjusting unit 520.

The first adjusting unit 510 may adjust the voltage levels of the first current path 'path 1' and the second current path 'path 2' of the current mirror 200 in response to the second voltage VDD. The first adjusting unit 510 may include switching elements NM3 and NM4.

The second adjusting unit 520 may block the leakage current of the second current path 'path 2' of the current mirror 200 in response to the inverted input signal INB.

The second adjusting unit 520 may include a delay circuit 521 and a switching element NM5. The delay circuit 521 may include a plurality of inverters 522. The delay circuit 521 may delay the inverted input signal INB and output a delayed input signal IN_Delay. The switching element NM5 may receive the delayed input signal IN_Delay as a gate signal.

A general level shifter is configured to receive the first voltage VCCQ of 1.2V and the second voltage VDD of 0.8V. Thus, the level shifter is generally constituted by thick oxide transistors which are operated at a driving voltage of 1.2V. As well known, when the level shifter is constituted by thick oxide transistors capable of receiving a driving voltage of 1.2V (for example, a gate voltage), a minimum of four transistors PM1, PM2, NM1 and NM2 are required.

The level shifter 150 in accordance with the present embodiment may be constituted only by thin oxide transistors which are operated at a driving voltage of 0.8V (for example, gate voltage) unlike a general level shifter.

However, when the level shifter 150 is constituted by thin oxide transistors driven at 0.8V, an additional adjusting unit, for example, an additional transistor is required to prevent a leakage current for 1.2V. Thus, the level shifter 150 in accordance with the present embodiment may require a larger number of transistors than the level shifter according to the related art.

However, the thick oxide transistor driven at 1.2V has a gate length of 130 nm to 230 nm, and the thin oxide transistor driven at 0.8V has a gate length of 16 nm to 32 nm. For this reason, although the level shifter 150 requires a larger number of thin oxide transistors than the level shifter according to the related art when the level shifter 150 is configured, the substantial area of the level shifter 150 in accordance with the present embodiment is reduced, compared to the level shifter according to the related art.

For example, when it is assumed that the first voltage VCCQ is 1.2 V and the second voltage VDD is 0.8 V, node voltage differences Vds, Vgs, and Vg have to be maintained, for example, to 1.06 V or below even in any operation condition to guarantee the reliability of all elements constituting the level shifter 150.

Accordingly, the level shifter 150 according to an embodiment may be designed to satisfy the above-described node voltage difference condition by constituting the first adjusting circuit 300 and the second adjusting circuit 400 and may improve stability and leakage current preventing capacity by additionally constituting the third adjusting circuit 500.

The switching elements PM3 to PM6 and NM3 to NM7 added to the level shifter 150 in accordance with the present embodiment serve to lower the voltages of the respective coupling nodes of the level shifter 150 to a voltage equal to or lower than the maximum allowable voltage (for example, 1.06V) of the thin oxide transistor. Thus, although a voltage equal to or higher than the driving voltage of the thin oxide transistor is inputted, the level shifter 150 in accordance with the present embodiment may perform a level shifting operation without a leakage current. The coupling nodes may serve as not only Vgs, Vds and Vgd voltage nodes of the switching elements PM1 to PM6 and NM1 to NM7 constituting the level shifter 150, but also coupling units among the switching elements PM1 to PM6 and NM1 to NM7.

The switching elements NM1, NM2 and PM1 to PM3 constituting the current mirror 200 may be configured as follows.

One terminal of a first switching element NM1 may be coupled to a ground terminal, the other terminal thereof may be coupled to a node Node_B, and a control terminal thereof may receive the input signal IN.

One terminals of the plurality of switching elements NM1, NM2, PM1, PM2, and PM3 may be sources or drains, the other terminals thereof may be drains or sources, and control terminals thereof may be gates.

The inverter INV1 may generate an inverted input signal INB by inverting the input signal IN.

One terminal of a second switching element NM2 may be coupled to the ground terminal, the other terminal thereof may be coupled to a node Node_E, and a control terminal thereof may receive the inverted input signal INB.

One terminal of a third switching element PM1 may be coupled to the first voltage VCCQ terminal and the other terminal thereof may be coupled to the output voltage OUT terminal.

One terminal of a fourth switching element PM2 may be coupled to the first voltage VCCQ terminal and the other terminal thereof may be coupled to a node Node_C.

One terminal of a fifth switching element PM3 may be coupled to the first voltage VCCQ terminal, the other terminal thereof may be commonly coupled to the control terminals of the third and fourth switching elements PM1 and PM2, and a control terminal thereof may receive the output voltage OUT.

One terminal of a sixth switching element PM4 may be coupled to the output voltage OUT terminal, the other terminal thereof may be coupled to a node Node_A, and a control terminal thereof may receive the first bias voltage Vbias_1.

The first bias voltage Vbias_1 may be, for example, 0.12V to 0.14V. The first bias voltage Vbias_1 is not limited only to 0.12V to 0.14V.

Since the sixth switching element PM4 may receive the first bias voltage Vbias_1 through the control terminal (for example, the gate), the output voltage OUT may be set to have a variation range corresponding to a voltage range (for example, Vbias_1+Vth_PM4 to VCCQ) in an AC operation. The output voltage OUT may be set to be fixed to a voltage level (for example, Vbias_1+Vth_PM4 or VCCQ) in a DC operation. Accordingly, the above-described node voltage difference condition may be satisfied.

The switching elements PM5, PM6, NM6 and NM7 constituting the second adjusting circuit 400 may be configured as follows.

One terminal of a seventh switching element PM6 corresponding to the output voltage compensation unit 410 may be coupled to the first voltage VCCQ terminal, the other terminal thereof may be coupled to the output voltage OUT terminal, and a control terminal thereof may receive the compensation voltage V_TIE.

Eighth to tenth switching elements PM5, NM6, and NM7 corresponding to the compensation voltage generation unit 420 may be coupled between the first voltage VCCQ terminal and the ground voltage terminal in series and may generate the compensation voltage V_TIE In response to the first voltage VCCQ. One terminal of the eighth switching element PM5 may be coupled to the first voltage VCCQ terminal, the other terminal thereof and a control terminal thereof may be coupled to one terminal of the ninth switching element PM6, in common. The one terminal of the ninth switching element NM6 may be coupled to the other terminal of the eighth switching element PM5, the other terminal thereof may be coupled to one terminal of tenth switching element NM7, and a control terminal thereof may be coupled to the first voltage VCCQ terminal. The one terminal of tenth switching element NM7 may be coupled to the other terminal of the ninth switching element NM6 and the other terminal and a control terminal thereof may be coupled to the ground voltage terminal, in common. Thus, the eighth switching element PM5 and the tenth switching element NM 7 may perform a diode operation.

The current mirroring of the seventh switching element PM6 may be accomplished in response to the compensation voltage V_TIE generated through the eighth to tenth switching elements PM5, NM6, and NM7 and the current according to the current mirroring may be supplied to the output voltage OUT terminal.

Since the current is continuously supplied to the output voltage OUT terminal through the seventh switching element PM6, the output voltage OUT may be prevented from being lowered less than the voltage level of Vbias_1+Vth_PM4 even when the input signal IN of a high level is input to the control terminal of the first switching element NM1.

The seventh switching element PM6 may prevent the voltage level of the output voltage OUT from being lowered less than the voltage level of Vbias_1+Vth_PM4, and thus the operation reliability of the third switching element PM1 may be guaranteed. That is, although a leakage current occurs in the third switching element PM1, a change of the output voltage which is caused by the leakage current can be prevented because the sixth switching element PM4 and the seventh switching element PM6 are coupled to the third switching element PM1. The third adjusting circuit 500 including the first and second adjusting units 510 and 520 may be configured as follows.

The first adjusting unit 510 may include an eleventh switching element NM3 and a twelfth switching element NM4. One terminal of the eleventh switching element NM3 which is arranged in the first current path 'path 1' may be coupled to the node Node_A, the other terminal thereof may be coupled to the node Node_B, and a control terminal thereof may receive the second voltage VDD.

Since the second voltage VDD is applied to the control terminal of the eleventh switching element NM3, the eleventh switching element NM3 may drop the voltage of the node Node_B by the voltage level of VDD-Vth_NM3 (i.e., the voltage level of the second voltage VDD minus the threshold voltage of the switching element NM3) and thus the operation reliability of the first switching element NM1 may be improved.

One terminal of the twelfth switching element NM4 which is arranged in the second current path 'path 2' may be coupled to the node Node_C, the other terminal thereof may be coupled to the node Node_D, and a control terminal thereof may receive the second voltage VDD.

The twelfth switching element NM4 may also be operated in the same manner as the eleventh switching element NM3 and the operation reliability of a thirteenth switching element NM5 to be described later may be improved.

As described above, the second adjusting unit 520 may include a delay circuit 521 and the thirteenth switching element NM5. The delay circuit 521 may be configured of an inverter array 521 including a plurality of inverters 522.

The inverter array 521 may generate a delayed input signal IN_Delay by delaying and inverting the inverted input signal INB.

One terminal of the thirteenth switching element NM5 may be coupled to the node Node_D, the other terminal thereof may be coupled to the node Node_E, and a control terminal thereof may receive the delayed input signal IN_Delay.

The thirteenth switching element NM5 may operate with a time delay with respect to the second switching element NM2 in response to the delayed input signal IN_Delay and mitigate the current path from being formed beyond a certain time or more required for the level transition of the output voltage OUT terminal and thus the leakage current may be minimized. When the second switching element NM2 is turned on, the thirteenth switching element NM5 is turned off. Thus, a leakage current path formed among the twelfth switching element NM4, the thirteenth switching element NM5 and the second switching element NM2 from the first voltage VCCQ terminal is blocked. In the AC mode, the thirteenth switching element NM5 may receive the delayed input signal IN_Delay, and thus momentarily lower the voltage levels of the voltage nodes Node_C, Node_D and Node_E. Therefore, the performance of the switching elements PM1 and PM2 configured to receive the voltage of the voltage node Node_C can be improved.

Figure 15:
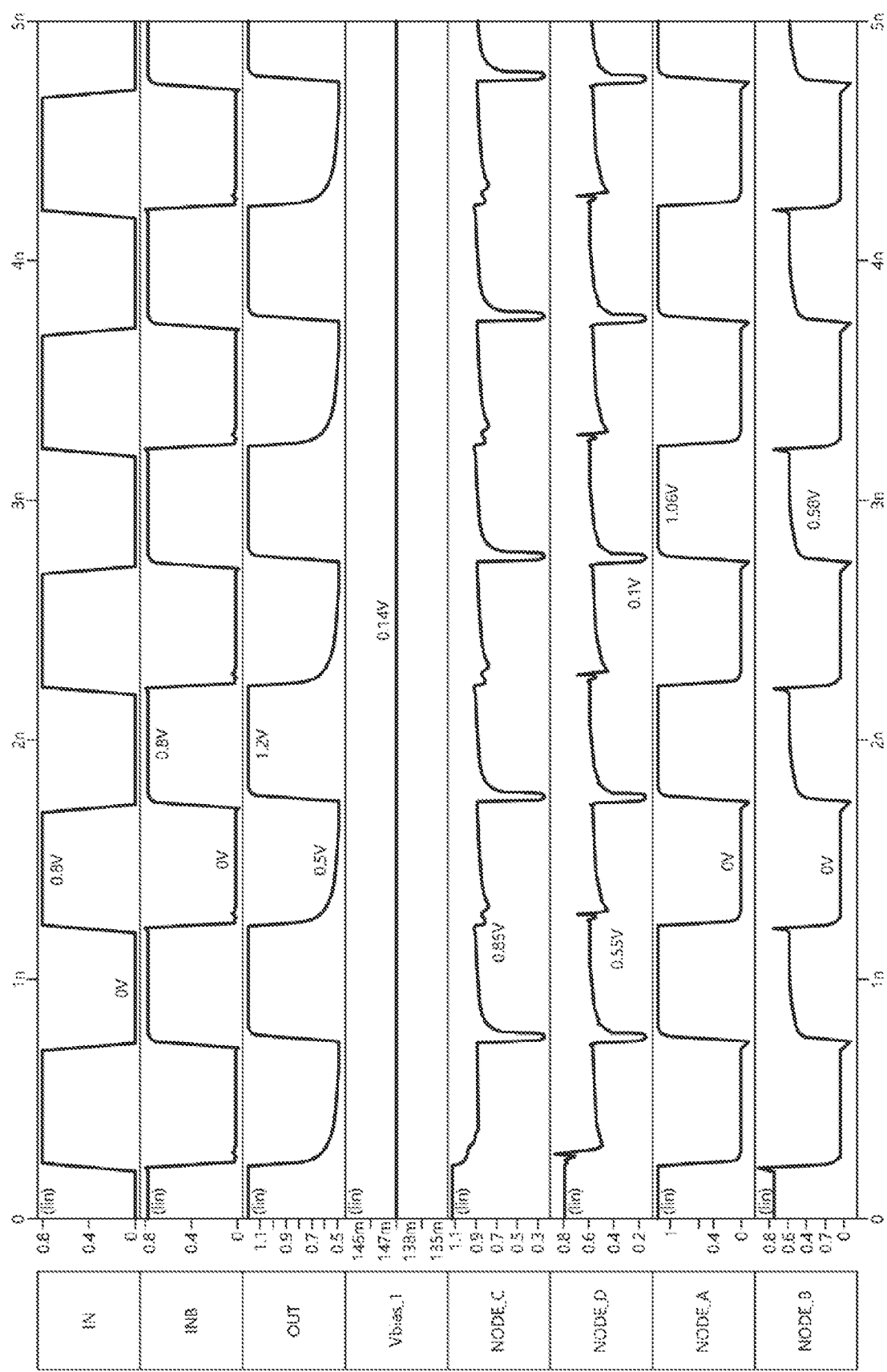
FIG. 15 is a diagram illustrating output timings of respective nodes of the level shifter of FIG. 14 according to an AC simulation.

FIG. 15 is a diagram illustrating output timings of the respective nodes of the level shifter of FIG. 14 according to an AC simulation.

Referring to FIG. 15, input signals IN and INB swing in a range of 0V to 0.8V (VDD), and an output voltage OUT swings in a range of 0.5V to 1.2V (VCCQ), in an AC manner.

The low level of the output voltage OUT may be set to 0.5V higher than 0V by an operation of the second adjusting circuit 300. More specifically, the sixth switching element PM4 of the second adjusting circuit 300 may receive a bias voltage Vbias_1 (for example, 0.14V) as a gate voltage. Under the supposition that the threshold voltage of the sixth switching element PM4 is −0.36V, for example, the sixth switching element PM4 is turned off when the source voltage of the sixth switching element PM4 becomes Vbias_1+Vth_PM4 (for example, 0.5V). Thus, when the first voltage VCCQ is 0V, the output voltage OUT is outputted as at least 0.5V.

Since the seventh switching element PM6 receives the compensation voltage V_TIE generated by the compensation voltage generation unit 420 as the gate voltage thereof, the seventh switching element PM6 may continuously supply a small amount of current to the output voltage OUT terminal. Thus, when the input signal IN inputted to the gate of the first switching element NM1 is enabled to a high level, the output voltage OUT is not lowered to Vbias_1+Vth_PM4 or less.

Since the output voltage OUT toggles at a voltage of 0.5V to 1.2V, the voltage Vds of the third switching element PM1 on the first current path 'path 1' has a level of VCCQ-OUT. Therefore, the third switching element PM1 is driven at a voltage lower than the maximum allowable voltage at all times. The node Node_A on the first current path 'path 1' is a drain node of the sixth switching element PM4. Since the sixth switching element PM4 receives the bias voltage Vbias_1 of 0.14V through a gate thereof and outputs the output voltage OUT through a source thereof, the voltage Vnode_A of the node A has a voltage level lower than the output voltage OUT, for example, OUT-Vbias_1. Thus, a reliability issue does not occur in the third switching element PM1 and the sixth switching element PM4, either. In the present embodiment, the maximum allowable voltage may indicate the maximum voltage at which a transistor can operate without a breakdown and punch-through. Thus, the reliability issue may indicate a leakage current caused by a breakdown or punch-through.

The node Node_B on the first current path 'path 1' corresponds to the source of the eleventh switching element NM3. The first switching element NM1 receives the second voltage VDD of 0V to 0.8V through a gate thereof, and receives the voltage Vnode_A of the Node_A through a drain thereof. Thus, since the voltage Vnode_B of the Node_B becomes Vnode_A-Vth_NM3 (about 0V to 0.58V) which is lower than the voltage Vnode_A of the Node A, a reliability issue does not occur in the eleventh switching element NM3, either.

Then, the input signal IN toggling at a voltage of 0V to 0.8V is received through the gate of the first switching element NM1, and the voltage Vnode_B of the Node_B is applied to the drain of the first switching element NM1. Thus, a reliability issue does not occur in the first switching element NM1, either.

The node Node_C on the second current path 'Path 2' corresponds to the gates of the third and fourth switching elements PM1 and PM2 and the drain of the fifth switching element PM3. The voltage Vnode_C of the Node C becomes VCCQ-Vth_PM2, and the simulation result was detected as a voltage of 0.23V to 0.85V.

Thus, since the voltage Vnode_C of the Node C is lower than the maximum allowable voltage of 1.06V, a reliability issue does not occur in the fourth switching element PM2, either.

The node Node_D of the second current path 'path2' corresponds to the source of the twelfth switching element NM4. Since the twelfth switching element NM4 receives the second voltage VDD of 0V to 0.8V through a gate thereof and receives the voltage Vnode_C of the Node C through a drain thereof, the voltage Vnode_D of the node Node_D becomes Vnode_C-Vth_NM4. The simulation result shows that the voltage Vnode_D of the Node_D has a range value of 0.1V to 0.55V, which is lower by the threshold voltage of the twelfth switching element NM4 than the voltage Vnode_C of the Node C. Therefore, all the voltages Vgs, Vgd and Vds of the twelfth switching element NM4 become equal to or less than the maximum allowable voltage of 1.06V.

The node Node_E on the second current path 'path 2' corresponds to the source of the thirteenth switching element NM5. The thirteenth switching element NM5 receives the delayed input voltage IN_delay, which toggles at a voltage of 0V to 0.8V, through a gate thereof, and receives the voltage Vnode_D of the Node D through a drain thereof. Therefore, the voltage Vnode_E of the Node_E may be set to a level lower by the threshold voltage Vth_NM5 of the thirteenth switching element NM5 than the voltage Vnode_D of the node D Node_D. Thus, a reliability issue does not occur in the thirteenth switching element NM5, either.

Since the second switching element NM2 of the second current path 'path2' receives the second voltage VDD through a gate thereof and receives the voltage Vnode_E of the Node_E through a drain thereof, a reliability issue does not occur in the second switching element NM2, either.

Table below shows the voltage levels of the nodes.

| | Voltage level | Simulation-results When the VCCQ = 0 V~1.2 V and VDD = 0 V~0.8 V |
|---|---|---|
| Vnode A | OUT-Vbias_1 | About 0.36~1.06 V |
| Vnode B | VNode A-Vth_NM3 | About 0 V~0.58 V |
| Vnode C | VCCQ-Vth_PM2 | About 0.23 V~0.85 V |
| Vnode D | Vnode_C-Vth_NM4 | About 0.1 V~0.55 V |
| Vnode E | Vnode_D-Vth_NM5 | Less than 0.3 V |
| OUT | Vbias_1 + Vth_PM4~VCCQ | About 0.5 V~1.2 V |

Therefore, since most of the transistors constituting the level shifter 150 are driven in a voltage range being less than the maximum allowable voltage range, a leakage current issue can be prevented even though the level shifter is constituted by thin oxide transistors.

Figure 16:
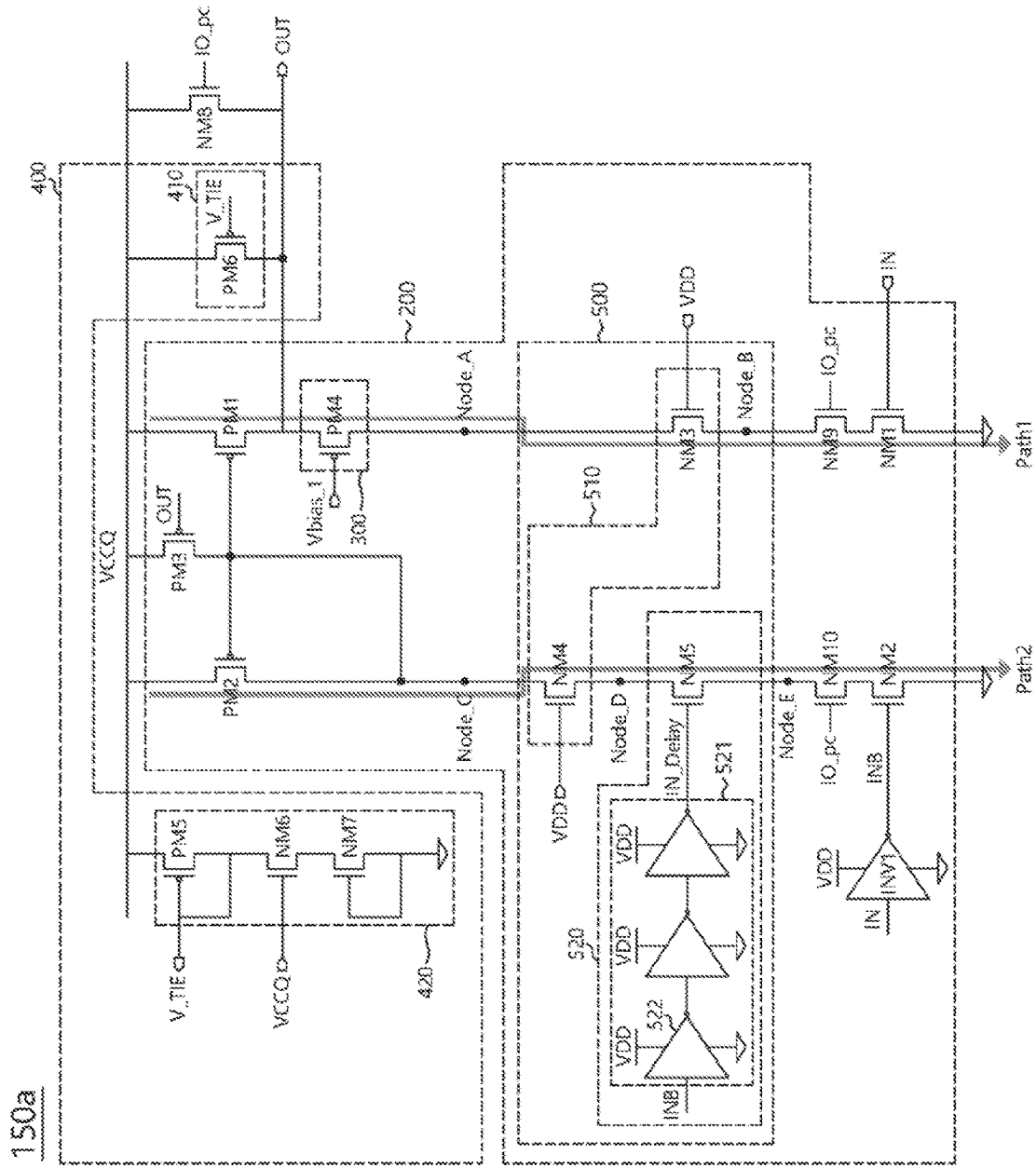
FIG. 16 is a circuit diagram illustrating a configuration of the level shifter of FIG. 13 in accordance with an embodiment.

FIG. 16 is a circuit diagram illustrating a configuration of the level shifter of FIG. 13 in accordance with an embodiment.

Referring to FIG. 16, a level shifter 150a in accordance with the present embodiment may further include first to third stabilization switches NM8, NM9 and NM10 in addition to the components of the level shifter 150 of FIG. 14.

The first stabilization switch NM8 may be coupled between the first voltage VCCQ terminal and the output voltage OUT terminal. The first stabilization switch NM8 may be an NMOS transistor, for example, and output the first voltage VCCQ as the output voltage OUT in response to the power control signal IO_pc.

The second stabilization switch NM9 may be coupled between the Node_B and the first switching element NM1. The second stabilization switch NM9 may also be configured as an NMOS transistor. The second stabilization switch NM9 may stably transfer the voltage Vnode_B of the Node_B to the drain of the first switching element NM1 in response to the power control signal IO_pc.

The third stabilization switch NM10 may be coupled between the Node_E and the second switching element NM2. The third stabilization switch NM10 may also be configured as an NMOS transistor. The third stabilization switch NM10 may stably transfer the voltage of the Node_E to the drain of the second switching element NM2 in response to the power control signal IO_pc.

The level shifter 150a in accordance with the present embodiment may be driven when the power voltage is stable, and thus perform a stable level shifting operation.

Figure 17:
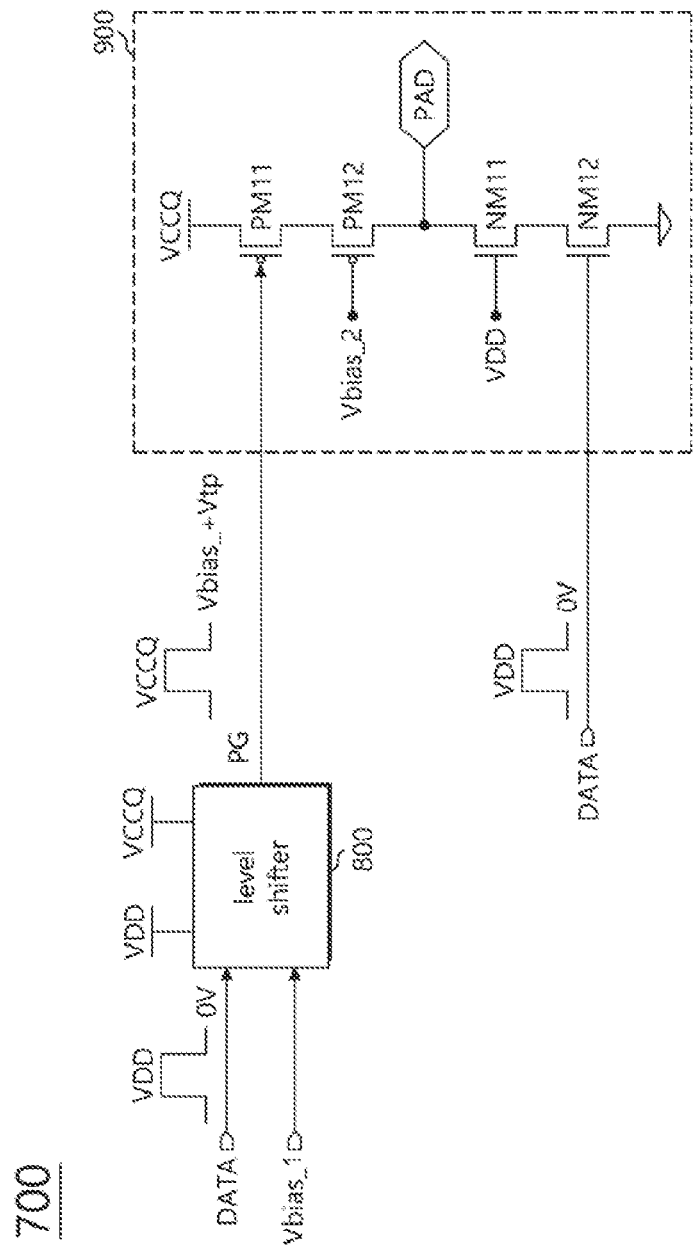
FIG. 17 is a diagram illustrating a configuration of a driver circuit according to an embodiment of the present disclosure.

FIG. 17 is a diagram illustrating a configuration of a driver circuit according to an embodiment of the present disclosure.

As illustrated in FIG. 17, a driver circuit 700 according to an embodiment may include a level shifter 800 and a pull-up/pull-down circuit 900.

The level shifter 800 may have the same configuration as that of the level shifter 150 of FIG. 14 or FIG. 16.

The level shifter 800 may receive data DATA provided from an external apparatus (not shown) such as a memory controller, a host device, and the like using the first bias voltage Vbias_1, adjust a level variation range of the data DATA to a level suitable for an apparatus (for example, a semiconductor memory) which uses the data, and generate the level-adjusted data as an output signal PG.

The data DATA may have a voltage variation range (0 V~VDD) of from a ground voltage level to a second voltage VDD level.

The output signal PG of the level shifter 800 may have a variation range corresponding to a voltage range of Vbias_1+Vtp~VCCQ.

The pull-up/pull-down circuit 900 may include a plurality of switching elements PM11, PM12, NM11, and NM12 coupled between the first voltage VCCQ terminal and the ground voltage terminal in series.

The first switching element PM11 may receive the output signal PG of the level shifter 800 through a control terminal thereof.

The second switching element PM12 may receive a second bias voltage Vbias_2 through a control terminal thereof.

The first switching element PM11 and the second switching element PM12 may pull up a level of an output terminal PAD to a second power voltage VCCQ level.

The output terminal PAD may be an input/output (I/O) pad of the semiconductor memory.

The third switching element NM11 may receive the second voltage VDD through a control terminal thereof.

The fourth switching element NM12 may receive the data DATA through a control terminal thereof.

The third switching element NM11 and the fourth switching element NM12 may pull down the level of the output terminal PAD to the ground voltage level.

The level shifter 800 may satisfy the node voltage difference conditions of all the elements constituting the level shifter 800 and thus the output voltage PG of the level shifter 800 may also have a variation range corresponding the voltage range of Vbias_1+Vtp~VCCQ. Accordingly, the high-speed operation of the first switching element PM11 which substantially conducts a driving operation of the driver circuit 700 may be accomplished and operation reliability of the first switching element PM11 may also be improved.

While various embodiments have been described above, it will be understood to those skilled in the art that the embodiments described are examples only. Accordingly, the operating method of a data storage device described herein should not be limited based on the described embodiments.

What is claimed is:

1. A semiconductor apparatus comprising:
   a control circuit configured to receive a first voltage and a second voltage having a voltage level different from a voltage level of the first voltage, and output a power control signal when the voltage level of the first voltage is higher than that of a first set voltage and the voltage level of a second voltage is higher than that of a second set voltage, the control circuit including at least one first type transistor; and
   a level shifter including a plurality of second type transistors which have a driving voltage lower than a driving voltage of the first type transistor, configured to receive the power control signal as a power voltage of the level shifter and adjust voltages applied to the plurality of second transistors.

2. The semiconductor apparatus according to claim 1, wherein the control circuit is configured to lower the voltage level of the second voltage after outputting the power control signal.

3. The semiconductor apparatus according to claim 1, wherein the control circuit comprises:
   a voltage detection circuit configured to generate a voltage detection signal in response to the voltage level of the first voltage and the voltage level of the second voltage.

4. The semiconductor apparatus according to claim 1, wherein the control circuit comprises:
   a voltage detection circuit configured to generate a voltage detection signal in response to the voltage level of the first voltage, the voltage level of the second voltage and a signal relating to a detection of the first voltage.

5. The semiconductor apparatus according to claim 1, wherein the control circuit comprises:
   a storage and output circuit configured to generate the power control signal in response to a voltage detection signal generated from a voltage detection circuit.

6. The semiconductor apparatus according to claim 1, wherein the control circuit comprises:
   a voltage detection circuit configured to generate a voltage detection signal when a signal relating to the first voltage is enabled and the voltage level of the second voltage becomes equal to or higher than the second set voltage level.

7. The semiconductor apparatus according to claim 1, wherein the control circuit comprises:
   a voltage detection circuit configured to disable a voltage detection signal when the voltage level of the first voltage is lower than that of the first set voltage.

8. The semiconductor apparatus according to claim 1, wherein the control circuit comprises:
   a storage and output circuit configured to latch a voltage detection signal and output the latched signal as the power control signal when the voltage detection signal is enabled.

9. The semiconductor apparatus according to claim 1, wherein the control circuit comprises:
   a voltage detection circuit configured to enable a voltage detection signal when a signal relating to a detection of the first voltage is enabled and the voltage level of the second voltage becomes higher than that of the second set voltage level; and
   a storage and output circuit configured to enable a current control signal when the voltage detection signal is enabled and the power control signal is generated by latching the enabled voltage detection signal.

10. The semiconductor apparatus according to claim 1, wherein the control circuit comprises:
   a voltage detection circuit configured to disable a voltage detection signal when the voltage level of the first voltage is lower than that of the first set voltage or when a current control signal is enabled.

11. The semiconductor apparatus according to claim 10, wherein the voltage detection circuit comprises:
   a first current source circuit configured to raise a voltage level of an input node of an inverter by passing a current to the input node in response to the current control signal; and
   a current sink circuit configured to lower the voltage level of the input node by sinking the current from the input node in response to the signal relating to the detection of the first voltage and the voltage level of the second voltage,
   wherein the inverter is configured to receive the voltage level of the input node and output the voltage detection signal.

12. The semiconductor apparatus according to claim 11, wherein the voltage detection circuit further comprises:
   a second current source circuit configured to raise the voltage level of the input node by passing a current to the input node in response to the signal relating to the detection of the first voltage;
   a third current source circuit configured to raise the voltage level of the input node by passing a current to the input node in response to the current control signal.

13. The semiconductor apparatus according to claim 11, wherein the first current source circuit comprises:
   a capacitor having one terminal configured to receive the current control signal and the other terminal coupled to a ground terminal;
   a transistor having a first node configured to receive the current control signal and a second node configured to receive the first voltage; and
   a resistor having one terminal coupled to a third node of the transistor and the other terminal coupled to the input node.

14. The semiconductor apparatus according to claim 12, wherein the third current source circuit has a first node configured to receive the first voltage, a second node configured to receive the current control signal, and a third node coupled to the input node.

15. The semiconductor apparatus according to claim 11, wherein the current sink circuit comprises:
   a first transistor having a first node configured to receive the second voltage and a second node coupled to a ground terminal; and
   a second transistor having a fourth node configured to receive the signal relating to the detection of the first voltage, a fifth node coupled to the input node, and a sixth node coupled to a third node of the first transistor.

16. The semiconductor apparatus according to claim 5, wherein the storage and output circuit comprises:
   a control signal generation circuit configured to generate a switch control signal which is enabled after the voltage detection signal is enabled, delay the voltage detection signal and output the delayed voltage detection signal as a current control signal; and
   a switch configured to output the voltage detection signal as a latch inversion signal after the switch control signal is enabled.

17. The semiconductor apparatus according to claim 16, wherein the storage and output circuit further comprises:
   a latch circuit configured to latch and invert the latch inversion signal and output the latched and inverted latch inversion signal as a latch signal; and
   a power control signal output circuit configured to generate the power control signal by comparing the voltage levels of the latch inversion signal and the latch signal.

18. The semiconductor apparatus according to claim 16, wherein the control signal generation circuit comprises:
   a Schmitt trigger circuit configured to generate a high-level output signal when the voltage detection signal is enabled and configured to generate a low-level output signal when the voltage detection signal is disabled.

19. The semiconductor apparatus according to claim 18, wherein the control signal generation circuit comprises:
   a first delay circuit configured to delay and invert either the high-level output signal or the low-level output signal of the Schmitt trigger circuit and configured to output a delayed and inverted signal; and
   a logic gate configured to receive either the high-level output signal or the low-level output signal of the Schmitt trigger circuit and the delayed and inverted signal outputted from the first delay circuit and configured to output the switch control signal.

20. The semiconductor apparatus according to claim 19, wherein the control signal generation circuit further comprises:
   a second delay circuit configured to delay and invert either the high-level output signal or the low-level output signal of the first delay circuit and configured to output another delayed and inverted signal as the current control signal.

21. The semiconductor apparatus according to claim 8, wherein the storage and output circuit comprises:
   a first transistor including a first gate configured to receive a latch signal from a latch circuit, a first source configured to be coupled to a ground terminal and a first drain;
   a second transistor including a second gate configured to receive a latch inversion signal, a second source configured to be coupled to the ground terminal and a second drain;
   a third transistor including a third gate configured to be coupled to the drain of the second transistor, a third source configured to receive the first voltage and a third drain configured to be coupled to the first drain of the first transistor;
   a fourth transistor including a fourth gate configured to be coupled to the drain of the first transistor, a fourth source configured to receive the first voltage and a fourth drain configured to be coupled to the second drain of the first transistor;
   a fifth transistor including a fifth gate configured to receive the voltage detection signal, a fifth source configured to receive the first voltage and a fifth drain configured to be coupled to a node to which the second and fourth transistors are coupled in common;
   an inverter configured to have an input terminal coupled to a node to which the second, fourth, and fifth transistors are coupled in common and an output terminal to output the power control signal; and
   a capacitor configured to have a first terminal coupled to the output terminal of the inverter and a second terminal coupled to the ground terminal.

22. The semiconductor apparatus according to claim 1, wherein the voltage applied to the plurality of second type transistors includes a voltage between a gate and a drain of the second type transistor, a voltage between a gate and a drain of the second type transistor and a voltage between the source and the drain of the second type transistor, and
wherein the level shifter is configured to lower a voltage level of an internal node coupling to one or more of the plurality of second type transistors.

23. The semiconductor apparatus according to claim 1, wherein the level shifter comprises:
a current mirror configured to receive an input signal in response to the first voltage and generate an output signal by mirroring a current corresponding to the second voltage based on a level of the input signal; and
an adjusting circuit coupled to a power voltage terminal which receives the second voltage in parallel to the current mirror and configured to adjust the voltage level of an output terminal of the current mirror.

24. The semiconductor apparatus according to claim 1, wherein the level shifter comprises:
an adjusting circuit coupled to an output terminal of a current mirror and configured to adjust a voltage level of the output terminal of the current mirror in response to a bias voltage.

25. The semiconductor apparatus according to claim 1, wherein the level shifter comprises:
an adjusting circuit coupled to a first current path and a second current path of a current mirror and configured to adjust voltage levels of the first current path and the second current path and to reduce a leakage current of the second current path.

26. The semiconductor apparatus according to claim 23, wherein the current mirror includes:
a first switching element of which one terminal is coupled to the power voltage terminal;
a second switching element of which one terminal is coupled to the power voltage terminal and the other terminal is coupled to the output terminal of the current mirror;
a third switching terminal of which one terminal is coupled to the power voltage terminal, the other terminal is commonly coupled to a control terminal of the first switching element and a control terminal of the second switching element, and a control terminal is coupled to the output terminal of the current mirror;
a fourth switching element of which the input signal is input to a control terminal; and
a fifth switching element of which an inverted input signal is input to a control terminal.

27. The semiconductor apparatus according to claim 24, wherein the level shifter further comprises:
a first stabilization switching element configured to activate the current mirror by transferring a voltage of a node to a node of a switching element coupled to the first current path in response to the power control signal; and
a second stabilization switching element configured to activate the current mirror by transfer a voltage of a node to a node of the switching element coupled to the second current path in response to the power control signal.

28. The semiconductor apparatus according to claim 23, wherein the adjusting circuit is configured to maintain a voltage level of an output voltage of the output terminal of the current mirror to be equal to or greater than a value, the value equal to a sum of the bias voltage and a threshold voltage of the adjusting circuit.

29. The semiconductor apparatus according to claim 1, wherein the first type transistor includes a gate insulating film with a first thickness, and the second type transistor includes a gate insulating film with a second thickness thinner than the first thickness.

* * * * *

UNITED STATES PATENT AND TRADEMARK OFFICE
CERTIFICATE OF CORRECTION

| | | |
|---|---|---|
| PATENT NO. | : 11,258,442 B2 | Page 1 of 1 |
| APPLICATION NO. | : 17/138634 | |
| DATED | : February 22, 2022 | |
| INVENTOR(S) | : Seung Ho Lee | |

It is certified that error appears in the above-identified patent and that said Letters Patent is hereby corrected as shown below:

On the Title Page

Item (63) Related U.S. Application Data:
Replace "Continuation of application No. 16/827,854, filed on March 23, 2020, now Pat. No. 10,892,750, which is a continuation-in-part of application No. 16/656,217, filed on Oct. 17, 2019, now Pat. No. 10,848,154, which is a continuation-in-part of application No. 16/227,975, filed on Dec. 20, 2018, now Pat. No. 10,763,835"

With --Continuation of application No. 16/827,584, filed on March 23, 2020, now Pat. No. 10,892,750, which is a continuation-in-part of application No. 16/656,217, filed on Oct. 17, 2019, now Pat. No. 10,848,154, which is a continuation-in-part of application No. 16/227,975, filed on Dec. 20, 2018, now Pat. No. 10,763,835--

Signed and Sealed this
Thirty-first Day of May, 2022

Katherine Kelly Vidal
*Director of the United States Patent and Trademark Office*